United States Patent
Ross et al.

(10) Patent No.: US 9,141,156 B2
(45) Date of Patent: Sep. 22, 2015

(54) COMPUTE NODE COOLING WITH AIR FED THROUGH BACKPLANE

(71) Applicant: Amazon Technologies, Inc., Reno, NV (US)

(72) Inventors: Peter George Ross, Olympia, WA (US); Darin Lee Frink, Seattle, WA (US); James R. Hamilton, Seattle, WA (US); Michael David Marr, Monroe, WA (US)

(73) Assignee: Amazon Technologies, Inc., Reno, NV (US)

( * ) Notice: Subject to any disclaimer, the term of this patent is extended or adjusted under 35 U.S.C. 154(b) by 182 days.

(21) Appl. No.: 13/958,382

(22) Filed: Aug. 2, 2013

(65) Prior Publication Data

US 2015/0036284 A1    Feb. 5, 2015

(51) Int. Cl.
*H05K 7/20*    (2006.01)
*G06F 1/20*    (2006.01)

(52) U.S. Cl.
CPC ... *G06F 1/20* (2013.01); *H05K 7/20* (2013.01)

(58) Field of Classification Search
CPC . H05K 7/20; H05K 7/20563; H05K 7/20736; H05K 7/20145; H05K 7/20718; H05K 1/14; G11B 33/142; G06F 1/141; H01L 23/367; H01L 23/467
USPC ......... 361/679.46–679.5, 690–697, 715–724; 165/80.2, 80.3, 104.33, 185, 121–126; 175/15.1, 16.1, 16.3; 454/184
See application file for complete search history.

(56) References Cited

U.S. PATENT DOCUMENTS

| | | | |
|---|---|---|---|
| 5,282,099 A | 1/1994 | Kawagoe et al. | |
| 5,544,012 A * | 8/1996 | Koike | 361/695 |
| 5,757,617 A | 5/1998 | Sherry | |
| 6,052,282 A * | 4/2000 | Sugiyama et al. | 361/690 |
| 6,186,890 B1 * | 2/2001 | French et al. | 454/184 |
| 6,234,591 B1 | 5/2001 | Driscoll et al. | |
| 6,259,605 B1 | 7/2001 | Schmitt | |
| 6,621,693 B1 | 9/2003 | Potter et al. | |
| 6,791,836 B2 | 9/2004 | Cipolla et al. | |
| 7,031,154 B2 | 4/2006 | Bash et al. | |
| 7,057,981 B2 | 6/2006 | Kano et al. | |
| 7,200,008 B1 | 4/2007 | Bhugra | |
| 7,236,362 B2 * | 6/2007 | Wang et al. | 361/695 |
| 7,256,992 B1 | 8/2007 | Stewart et al. | |
| 7,283,358 B2 | 10/2007 | Campbell et al. | |
| 7,359,186 B2 | 4/2008 | Honda et al. | |

(Continued)

OTHER PUBLICATIONS

U.S. Appl. No. 13/958,387, filed Aug. 2, 2013, Peter George Ross.

(Continued)

*Primary Examiner* — Michail V Datskovskiy
(74) *Attorney, Agent, or Firm* — Robert C. Kowert; Meyertons, Hood, Kivlin, Kowert & Goetzel, P.C.

(57) ABSTRACT

A computing system includes a chassis, one or more backplanes coupled to the chassis. Computing devices are coupled to the one or more backplanes. The one or more backplanes include backplane openings that allow air to pass from one side of the backplane to the other side of the backplane. Air channels are formed by adjacent circuit board assemblies of the computing devices and the one or more backplanes. Channel capping elements at least partially close the air channels.

18 Claims, 16 Drawing Sheets

(56) References Cited

U.S. PATENT DOCUMENTS

| | | | |
|---|---|---|---|
| 7,722,359 B1* | 5/2010 | Frangioso et al. | 439/61 |
| 7,869,210 B2 | 1/2011 | Moss | |
| 8,064,200 B1* | 11/2011 | West et al. | 361/695 |
| 8,191,841 B2 | 6/2012 | Jeffery et al. | |
| 8,331,095 B2 | 12/2012 | Hu et al. | |
| 8,400,765 B2 | 3/2013 | Ross | |
| 8,630,087 B1* | 1/2014 | Reynov et al. | 361/679.5 |
| 8,743,549 B2 | 6/2014 | Frink et al. | |
| 8,908,372 B1* | 12/2014 | West et al. | 361/695 |
| 2004/0057203 A1 | 3/2004 | Rabinovitz | |
| 2004/0218355 A1 | 11/2004 | Bash et al. | |
| 2004/0233643 A1 | 11/2004 | Bolich et al. | |
| 2005/0057898 A1 | 3/2005 | El-Batal et al. | |
| 2005/0117462 A1 | 6/2005 | Kano et al. | |
| 2005/0166860 A1 | 8/2005 | Austin et al. | |
| 2005/0237716 A1 | 10/2005 | Chu et al. | |
| 2005/0270681 A1 | 12/2005 | Suzuki et al. | |
| 2006/0087760 A1 | 4/2006 | Forrer, Jr. et al. | |
| 2006/0187634 A1 | 8/2006 | Tanaka et al. | |
| 2006/0274496 A1 | 12/2006 | Lee et al. | |
| 2007/0053169 A1 | 3/2007 | Carlson et al. | |
| 2007/0091559 A1 | 4/2007 | Malone | |
| 2007/0233781 A1 | 10/2007 | Starr et al. | |
| 2008/0099235 A1 | 5/2008 | Hiramoto et al. | |
| 2008/0112127 A1 | 5/2008 | June et al. | |
| 2008/0285232 A1 | 11/2008 | Claassen et al. | |
| 2009/0086441 A1 | 4/2009 | Randall et al. | |
| 2009/0144568 A1 | 6/2009 | Fung | |
| 2010/0014248 A1* | 1/2010 | Boyden et al. | 361/695 |
| 2011/0036554 A1* | 2/2011 | Scheidler et al. | 165/281 |
| 2011/0185099 A1 | 7/2011 | Stuhlsatz et al. | |
| 2012/0069514 A1 | 3/2012 | Ross | |
| 2012/0243170 A1 | 9/2012 | Frink et al. | |
| 2012/0327597 A1* | 12/2012 | Liu et al. | 361/692 |
| 2013/0094138 A1 | 4/2013 | Meza et al. | |

OTHER PUBLICATIONS

U.S. Appl. No. 13/791,192, filed Mar. 8, 2013, Peter George Ross.
U.S. Appl. No. 12/886,469, filed Sep. 20, 2010, Peter G. Ross.
U.S. Appl. No. 12/886,440, filed Sep. 20, 2010, Peter G. Ross.
U.S. Appl. No. 12/886,437, filed Sep. 20, 2010, Peter G. Ross.
International Search Report and Written Opinion from PCT/US2014/049475, mailed Nov. 17, 2014, Amazon Technologies, Inc., pp. 1-12.

* cited by examiner

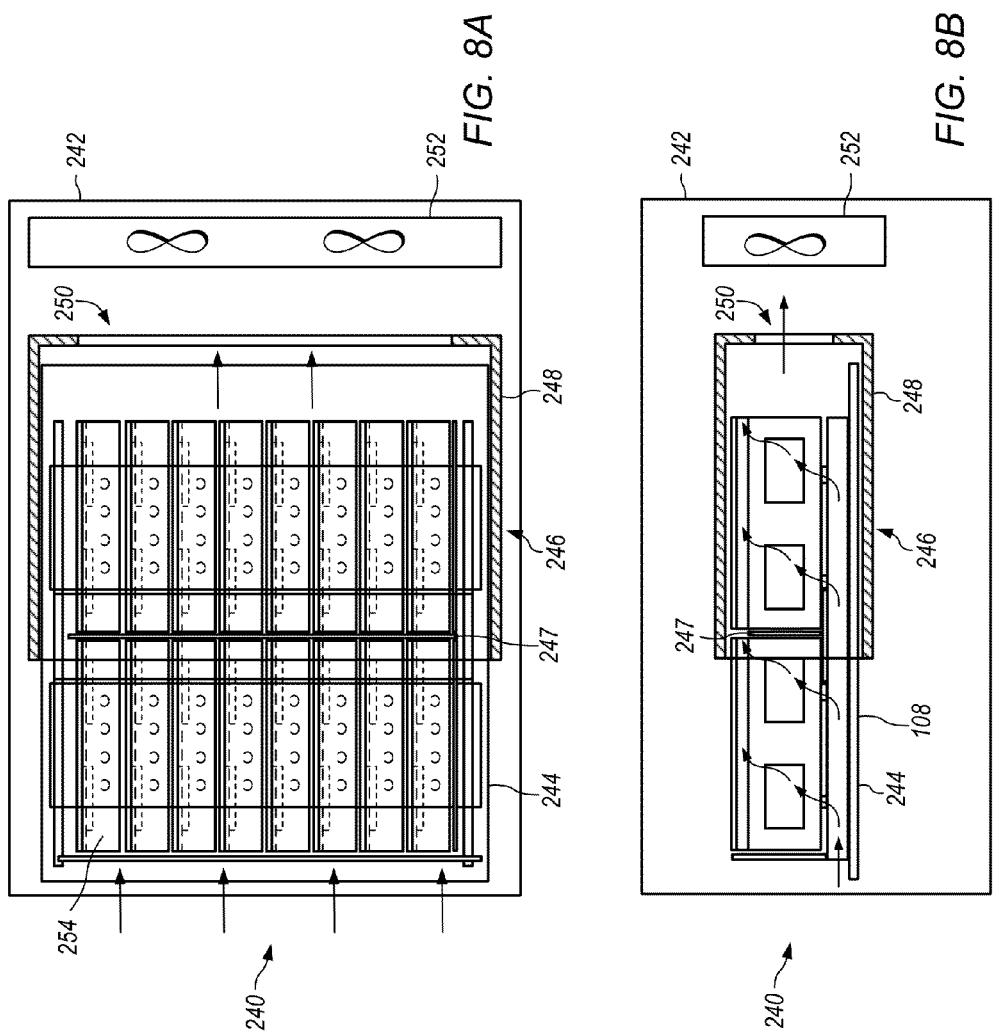

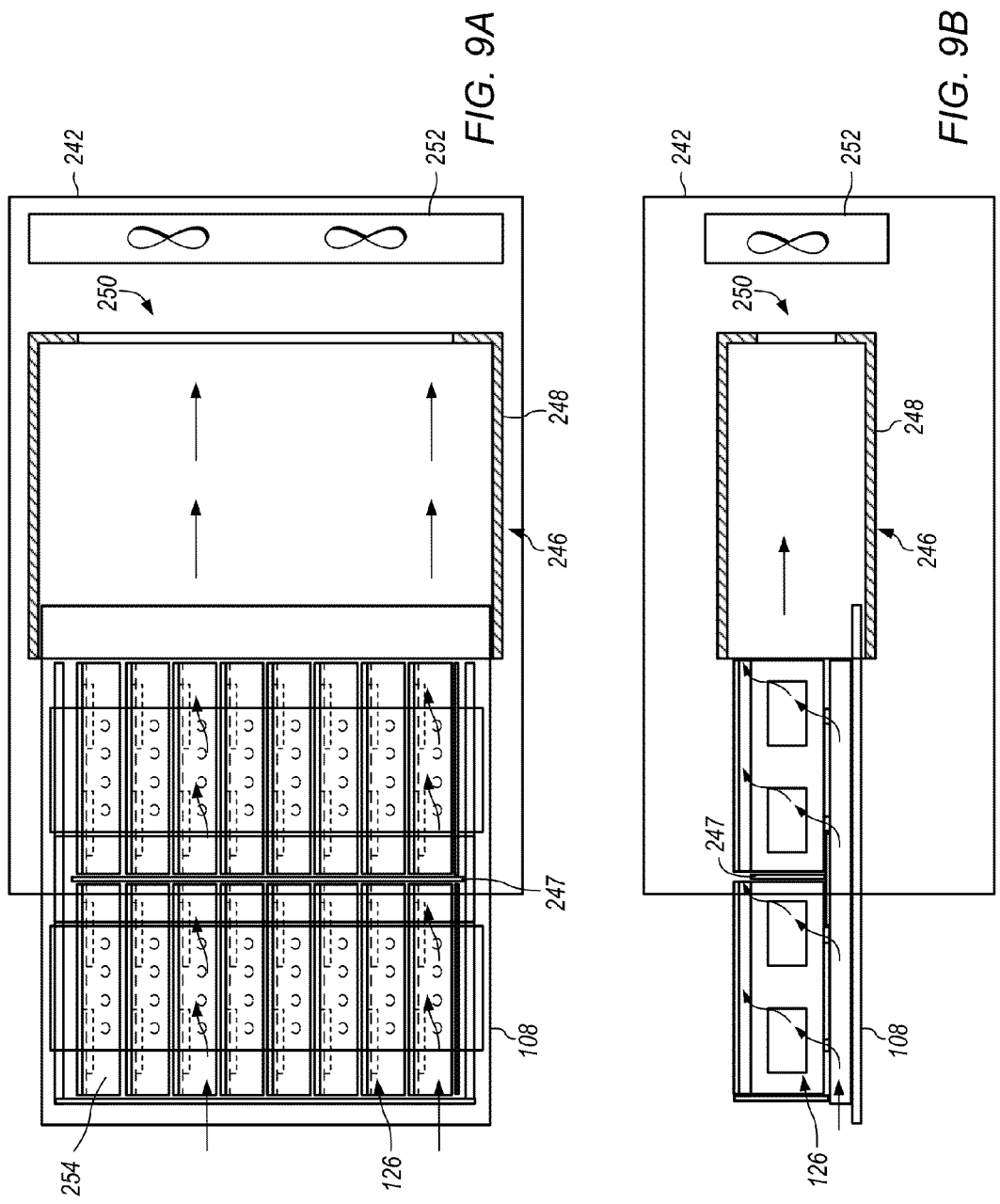

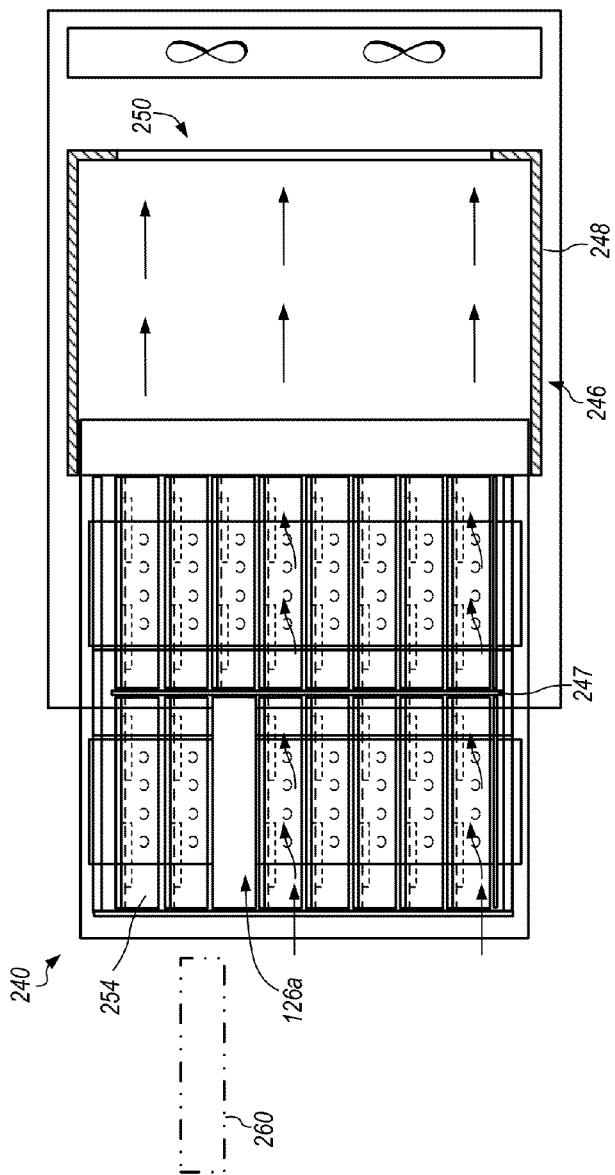
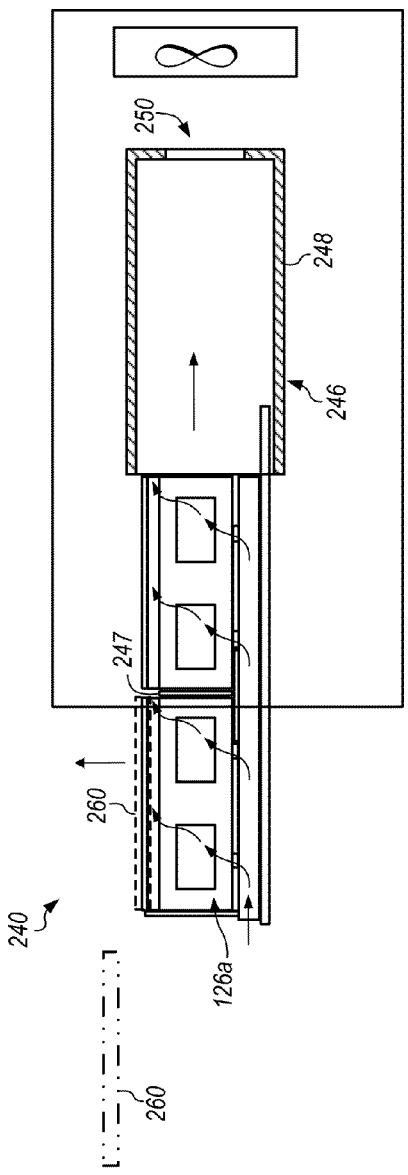
FIG. 11A
FIG. 11B

COMPUTE NODE COOLING WITH AIR FED THROUGH BACKPLANE

BACKGROUND

Organizations such as on-line retailers, Internet service providers, search providers, financial institutions, universities, and other computing-intensive organizations often conduct computer operations from large scale computing facilities. Such computing facilities house and accommodate a large amount of server, network, and computer equipment to process, store, and exchange data as needed to carry out an organization's operations. Typically, a computer room of a computing facility includes many server racks. Each server rack, in turn, includes many servers and associated computer equipment.

Computer systems typically include a number of components that generate waste heat. Such components include printed circuit boards, mass storage devices, power supplies, and processors. For example, some computers with multiple processors may generate 250 watts of waste heat. Some known computer systems include a plurality of such larger, multiple-processor computers that are configured into rack-mounted components, and then are subsequently positioned within a rack system.

Some known data centers include methods and apparatus that facilitate waste heat removal from rack systems. Many existing methods and apparatus may not, however, provide air for cooling in an effective manner to where it is most needed. Moreover, some known data centers include rack systems having configurations that are non-uniform with respect to component density and usage, such that different parts of a rack generate waste heat at a different rate compared to other parts of the rack.

In many rack systems, fans are used to move air through rack-mounted computer systems to remove heat from components in the computer systems. For example, air may be moved from front to back in the rack. Typically, some areas within a given computer system receive more cooling air than others. Components in areas of a computer system that are not well cooled may be prone to failure.

As with other components, servers fail from time to time while in service. To restore the systems to full operation, servers may need to be powered down and removed from a rack so that the defective components can be replaced or repaired. In systems where many servers are mounted on a common chassis, all of the servers on the chassis must be withdrawn from the rack in order to service one failed server. In this case, cooling air to all of the servers on that chassis is lost, which may impair performance or cause additional failures in the servers on the chassis.

BRIEF DESCRIPTION OF THE DRAWINGS

FIGS. 8A and 8B illustrate top and side views of a computing system with sled-mounted compute nodes installed in a rack.

FIGS. 9A and 9B illustrate top and side views of a computing system with sled-mounted compute nodes with the sled partially withdrawn from the rack with continued air flow through channels between compute nodes.

FIGS. 11A and 11B illustrate top and side views of a computing system with a dummy plate in covering a gap where a compute node has been removed.

Figure 1:
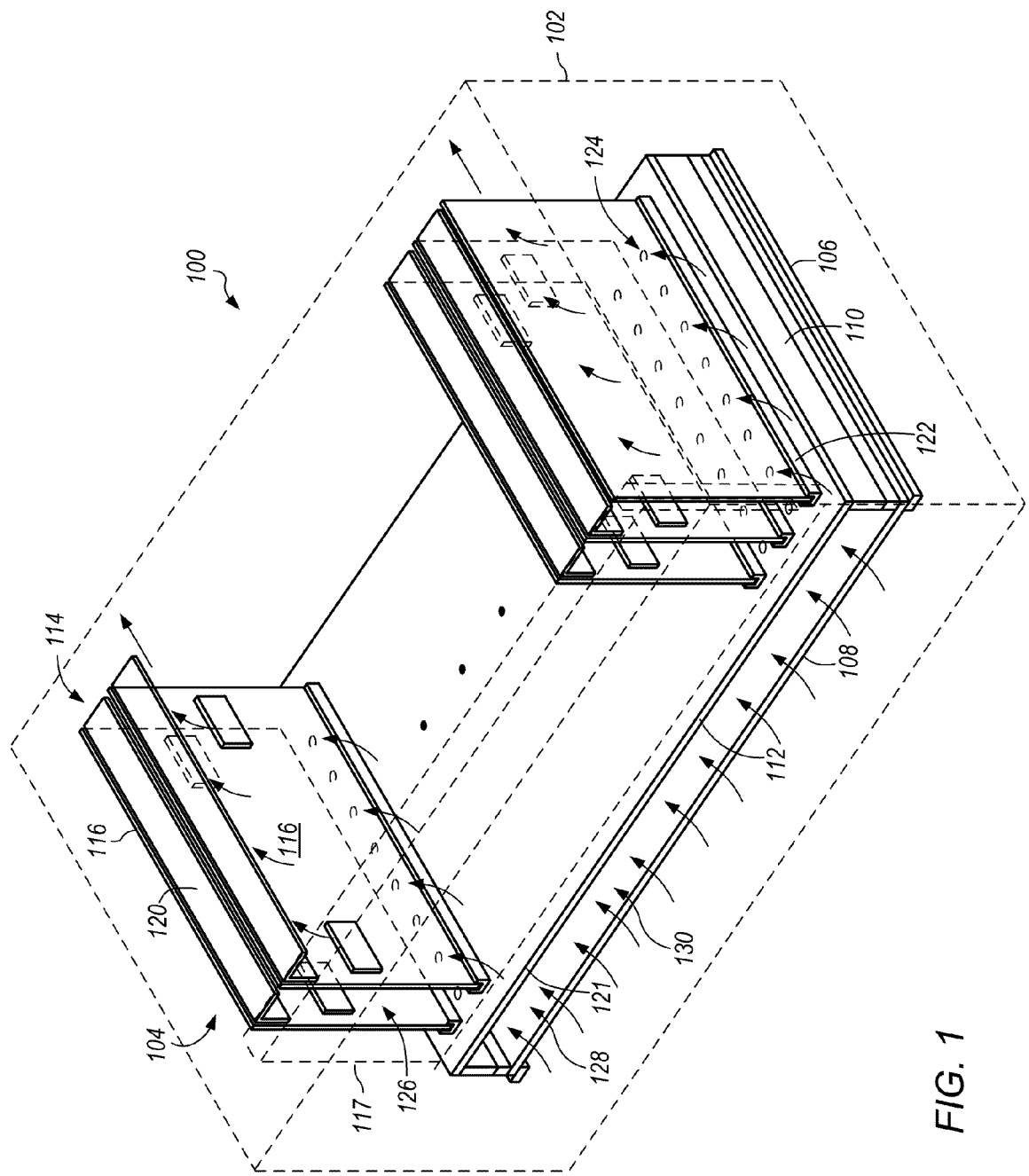
FIG. 1 illustrates one embodiment of a computing system having compute nodes with channel-capping elements mounted on a common backplane with air flow introduced into the channels from under a backplane.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims. The headings used herein are for organizational purposes only and are not meant to be used to limit the scope of the description or the claims. As used throughout this application, the word "may" is used in a permissive sense (i.e., meaning having the potential to), rather than the mandatory sense (i.e., meaning must). Similarly, the words "include," "including," and "includes" mean including, but not limited to.

DETAILED DESCRIPTION OF EMBODIMENTS

Various embodiments of computer systems, and systems and methods for performing computing operations, are disclosed. According to one embodiment, a computing system includes a chassis, an air inlet end, an air exit end, one or more backplanes coupled to the chassis. Computing devices are coupled to the one or more backplanes. The computing devices may include a circuit board assembly and one or more processors. The computing system includes an air passage adjacent to the backplanes and air channels. The air channels can channel air between pairs of adjacent circuit board assemblies. The air passage receives air from the air inlet end of the system. The one or more backplanes include openings that allow air to pass from the air passage to the air channels. One or more of the openings is farther from the air inlet end than at least one other of the openings.

According to one embodiment, a method of cooling computing devices on a chassis includes introducing air at a first end of a system into an air passages on one side (for example, the bottom side) of one or more backplanes. Air from air passage is moved through openings in the backplanes and in channels formed between adjacent circuit board assemblies mounted on the other side (for example, the top) of the backplanes. Air is expelled at a second end of the system that is opposite the first end. One or more of the openings is farther from the air inlet end than at least one other of the openings.

According to one embodiment, a method of changing a configuration of computer system includes removing a first set of backplanes from a chassis for the computing system to create open space in the chassis. A second set of backplanes is installed the open space in the chassis. The second set of backplanes supports a second set of computing devices in two or more rows between one end and another end of the chassis at a pitch from row to row that is different from that of the first set of computing devices.

According to one embodiment, a computing system includes a chassis, one or more backplanes coupled to the chassis. Computing devices are coupled to the one or more backplanes. The one or more backplanes include backplane openings that allow air to pass from one side of the backplane to the other side of the backplane. Air channels are formed by adjacent circuit board assemblies of the computing devices and the one or more backplanes. Channel capping elements at least partially close the air channels.

According to one embodiment, a method of cooling computing devices includes moving air below a backplane through one or more openings in the backplane into one or more air channels formed by adjacent circuit board assemblies on the backplane. Air is moved down the air channels to remove heat from heat producing components on the circuit board assemblies.

According to one embodiment, a system includes a rack and computing systems coupled to the rack. The computing systems may include a chassis, computing devices coupled to the chassis, and air channels formed between at least two of the computing devices. The rack supports a computing system while the computing system is partially withdrawn from the rack. The computing system may remain in operation while the computing system is partially withdrawn from the rack. Air may be directed through the air channels while the computing system is partially withdrawn from the rack and remains in operation.

According to one embodiment, a method of performing maintenance on a computing system includes at least partially withdrawing a computing system from a rack, moving air through air channels between adjacent circuit boards in the computing system while the computing system is in the withdrawn position. Operations to maintain the computing system are performed while the computing system is in the withdrawn position and while air is moved through the air channels between circuit boards.

As used herein, "air handling system" means a system that provides or moves air to, or removes air from, one or more systems or components.

As used herein, "air moving device" includes any device, element, system, or combination thereof that can move air. Examples of air moving devices include fans, blowers, and compressed air systems.

As used herein, an "aisle" means a space next to one or more elements, devices, or racks.

As used herein, "backplane" means a plate or board to which other electronic components, such as mass storage devices, circuit boards, can be mounted. In some embodiments, hard disk drives are plugged into a backplane in a generally perpendicular orientation relative to the face of the backplane. In some embodiments, a backplane includes and one or more power buses that can transmit power to components on the backplane, and one or more data buses that can transmit data to and from components installed on the backplane.

As used herein, "ambient" means, with respect to a system or facility, the air surrounding at least a portion of the system or facility. For example, with respect to a data center, ambient air may be air outside the data center, for example, at or near an intake hood of an air handling system for the data center.

As used herein, a "cable" includes any cable, conduit, or line that carries one or more conductors and that is flexible over at least a portion of its length. A cable may include a connector portion, such as a plug, at one or more of its ends.

As used herein, "circuit board" means any board or plate that has one or more electrical conductors transmitting power, data, or signals from components on or coupled to the circuit board to other components on the board or to external components. In certain embodiments, a circuit board is an epoxy glass board with one or more conductive layers therein. A circuit board may, however, be made of any suitable combination of materials.

As used herein, "chassis" means a structure or element that supports another element or to which other elements can be mounted. A chassis may have any shape or construction, including a frame, a sheet, a plate, a box, a channel, or a combination thereof. In one embodiment, a chassis is made from one or more sheet metal parts. A chassis for a computer system may support circuit board assemblies, power supply units, data storage devices, fans, cables, and other components of the computer system.

As used herein, to "close" an open channel means to at least partially enclose the channel such that air is inhibited from escaping the channel.

As used herein, "computing" includes any operations that can be performed by a computer, such as computation, data storage, data retrieval, or communications.

As used herein, "computing systems" includes any of various systems or devices in which computing operations can be carried out, such as computer systems or components thereof. One example of a computing system is a rack-mounted server that includes one or more computing devices. As used herein, the term computing device is not limited to just those integrated circuits referred to in the art as a computer, but broadly refers to a processor, a server, a microcontroller, a microcomputer, a programmable logic controller (PLC), an application specific integrated circuit, and other programmable circuits, and these terms are used interchangeably herein. Some examples of computing devices include e-commerce servers, network devices, telecommunications equipment, medical equipment, electrical power management and control devices, and professional audio equipment (digital, analog, or combinations thereof). In various embodiments, memory may include, but is not limited to, a computer-readable medium, such as a random access memory (RAM). Alternatively, a compact disc-read only memory (CD-ROM), a magneto-optical disk (MOD), and/or a digital versatile disc (DVD) may also be used. Also, additional input channels may include computer peripherals associated with an operator interface such as a mouse and a keyboard. Alternatively, other computer peripherals may also be used that may include, for example, a scanner. Furthermore, in the some embodiments, additional output channels may include an operator interface monitor and/or a printer.

As used herein, "data center" includes any facility or portion of a facility in which computer operations are carried out. A data center may include servers dedicated to specific functions or serving multiple functions. Examples of computer operations include information processing, communications, testing, simulations, power distribution and control, and operational control.

As used herein, to "direct" air includes directing or channeling air, such as to a region or point in space. In various embodiments, air movement for directing air may be induced by creating a high pressure region, a low pressure region, or a combination both. For example, air may be directed downwardly within a chassis by creating a low pressure region at the bottom of the chassis. In some embodiments, air is directed using vanes, panels, plates, baffles, pipes or other structural elements.

As used herein, "member" includes a single element or a combination of two or more elements (for example, a member can include two or more sheet metal parts fastened to one another.

As used herein, a "module" is a component or a combination of components physically coupled to one another. A module may include functional elements and systems, such as computer systems, circuit boards, racks, blowers, ducts, and power distribution units, as well as structural elements, such a base, frame, housing, or container.

As used herein, "open channel" means a channel that is open along at least a portion of the length of the channel.

As used herein, "primarily horizontal" means more horizontal than vertical. In the context of an installed element or device, "primarily horizontal" includes an element or device whose installed width is greater than its installed height.

As used herein, "primarily vertical" means more vertical than horizontal. In the context of an installed element or device, "primarily vertical" includes an element or device whose installed height is greater than its installed width. In the context of a hard disk drive, "primarily vertical" includes a hard disk drive that is installed such that the installed height of the hard disk drive is greater than the installed width of the hard disk drive.

As used herein, a "rack" means a rack, container, frame, or other element or combination of elements that can contain or physically support one or more computer systems.

As used herein, "room" means a room or a space of a building. As used herein, "computer room" means a room of a building in which computer systems, such as rack-mounted servers, are operated.

As used herein, a "space" means a space, area or volume.

As used herein, "shelf" means any element or combination of elements on which an object can be rested. A shelf may include, for example, a plate, a sheet, a tray, a disc, a block, a grid, or a box. A shelf may be rectangular, square, round, or another shape. In some embodiments, a shelf may be one or more rails.

As used herein, "shock absorbing", as applied to a supporting element for another element, means that the supporting element absorbs mechanical energy and/or dampens shock and/or vibration loads. A shock-absorbing material may be elastic, viscoelastic, viscous, or combinations thereof.

In some embodiments, a computing system (for example, a computing module) includes a chassis, one or more backplanes in a horizontal orientation, and computing devices (for example, compute nodes) on the backplanes. The computing system has an air inlet end and an air exit end. The computing system includes an air passage under the backplanes and air channels between the computing devices on the backplanes. Openings in the backplanes allow air to move from the air passage under the backplanes into the air channels between the computing devices. Some of the openings in the backplanes are farther away from the system air inlet end than other openings (for example, deeper in the chassis). The air passage under the backplanes and the air channels may run lengthwise between the system air inlet and the system air exit (for example, lengthwise front-to-back). In some cases, the chassis accommodates multiple backplanes arranged in a row from front to back of the chassis (for example, one backplane behind another). The number of backplanes and depth of each backplane may be changed depending on the needs of the system.

FIG. 1 illustrates one embodiment of a computing system having compute nodes mounted on a common backplane with air flow introduced into the channels from under a backplane. System 100 includes rack 102 and computing system 104. Computing system 104 is mounted on rails 106 of rack 102. Rails 106 may be fixed on vertical posts in rack 102 (not shown for clarity).

Computing system 104 includes sled 108, risers 110, backplane 112, and compute node assemblies 114. Sled 108 may serve as a chassis for components of computing system 104. Each of compute node assemblies 114 includes compute node printed circuit board 116, processors 118, and channel-capping rim 120.

Backplane 112 includes backplane circuit board 121, card guides 122 and openings 124. Each of compute node assemblies 114 is mounted on backplane 112. Backplane openings 124 are provided in backplane circuit board 121. Backplane openings 124 are spaced from one another in a row from front to rear of backplane 112.

Channels 126 are formed between adjacent compute node assemblies 114. Each channel 126 is formed by a pair of adjacent compute node printed circuit boards 116 and the portion of backplane circuit board 121 between those two adjacent compute node printed circuit boards 116. Openings 124 may be located on circuit board 121 in backplane circuit board 121 between each pair of adjacent compute node printed circuit boards 116. Each of compute node assemblies 114 may include network I/O connectors, power connectors, and signal connectors to support operation of compute node assemblies 114.

Computing system 104 may include one or more power supply units. Each power supply unit may supply power to one or more of compute node assemblies 114. In one embodiment, a power supply unit is installed at the front of a computing system (for example, in front of the row of compute node printed circuit boards 116).

Computing system 104 may include one or more mass storage devices, such as hard disk drives. Each mass storage device may be accessible by one or more of compute node assemblies 114. In certain embodiments, mass storage devices are mounted on a common chassis with printed circuit boards for one or more compute nodes.

Shared resource module 117 is mounted at the front of sled 108. Shared resource module 117 may include modules to provide resources to compute nodes 130. Compute node assemblies 114 may share common resource devices, such as power supply units, mass storage devices (for example, hard disk drives) or network switches. Shared resource module 114 may include an enclosure or mounting brackets. Shared resource module 117 may block air from entering in the gaps between compute node assembly circuit boards 116, such that all of the air entering the system is introduced to the inter-node channels through openings in backplane 112.

Backplane 112 is amounted on sled 108 by way of risers 110. Risers 110 create space 128 between sled 108 and backplane 112. Front inlet opening 130 to space 124 is at the front of computing system 104 between the front edges of sled 108 and backplane 112. A back plate may be included at the rear edges of sled 108 and backplane 112 to cap off space 128 at the rear of the sled.

Sled 108 may be carried on rails 106 of rack 102. Computing system 104 may be slid in and out of rack 102 on sled 108. In various embodiments, computing system 104 may be supported on other types of support systems, such as a shelf, plate, hangers, or telescoping rails.

In various embodiments described above, each of the processors on a circuit board may operate as a separate compute node. In certain embodiments, however, circuit board assemblies on a dual-processor board may cooperate to function as a single compute node. In certain embodiments, two or more processors on a multiple processor circuit board assembly share access to some or all of the hard disk drives in a compute module.

Channel-capping rims 120 may serve as channel-capping and/or channel-enclosing elements for channels 126. In the embodiment illustrated in FIG. 1, channel-capping rims 120 may be in the form of an angle attached to compute node printed circuit board 116 near the top of the circuit board. In various embodiments, however, a channel between circuit boards may be closed by other elements or members. Examples of other closing elements include plates, blocks, rims, beads, or plugs of various dimensions.

In some embodiments, channels between adjacent circuit boards are fully closed. In certain embodiments, the edge of channel-capping rim 120 attached to one circuit board may seal on the adjacent circuit board. In some embodiments, a channel-enclosing element includes a sealing element. For example, each of channel-capping rims 120 may include a rubber seal along its edge that contacts the adjacent circuit board to enclose channels 126.

In some embodiments, an air moving device creates negative pressure at the rear of computing system 104. Air may be drawn through front inlet opening 130 and into space 128 under backplane 112. Air in space 128 may be drawn through backplane openings 124 and into channels 126. Air in channels 126 may flow upwardly and toward the rear of computing system 104 and across heat producing components on compute node printed circuit boards 116. Channel-capping elements 120 may contain the moving air in channels 126. Air in space 124 may remain unheated until it passes into channels 126 and receives heat from heat producing components on the circuit boards. As such, air entering channels 126 through backplane openings 124 near the rear of computing system 104 may be as cool as air entering channels 126 through backplane openings 124 near the rear of computing system 104.

For illustrative purposes, rack 102 is shown with only one of computing systems 104. In various embodiments, however, a rack may hold any number of computing systems, compute nodes, systems or components.

Figure 2:
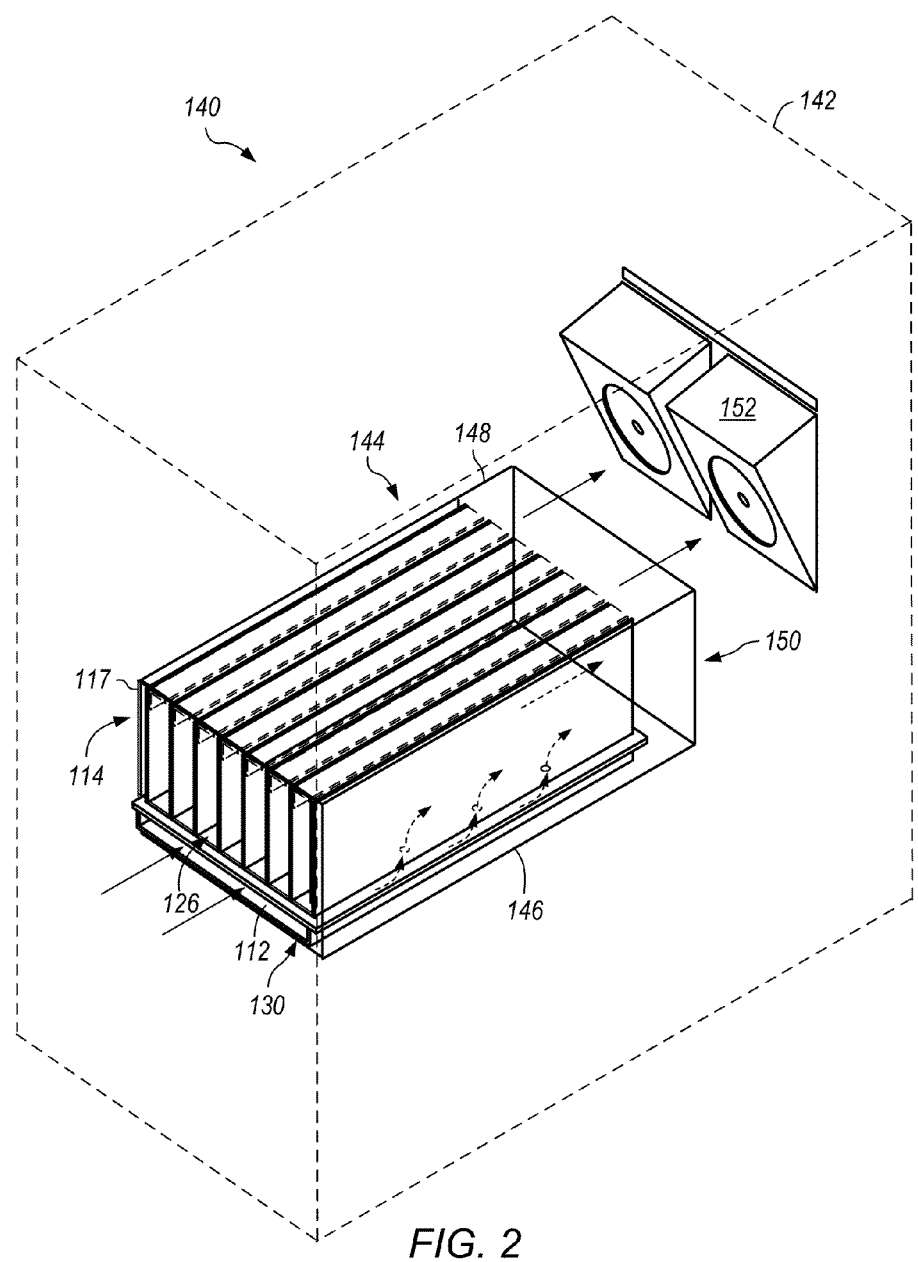
FIG. 2 illustrates one embodiment of a rack housing a computing system with sled-mounted compute nodes having channel-capping elements.

FIG. 2 illustrates one embodiment of a rack housing a computing system with sled-mounted compute nodes having channel-capping elements. System 140 includes rack 142 and computing system 144. Computing system 144 may be similar to computing system 104 described above relative to FIG. 1. Rack 142 includes computing system shelf 146. Shelf 146 includes box 148 and rear opening 150. Computing system 144 is supported on shelf 146. Rack 142 includes rear fans 152. Rear fans 152 may draw air through front inlet opening 130 into space below backplane 112, through backplane openings 124 in backplane 112 and into channels 126, through channels 126, and through rear opening 150 of shelf 146. Air moving through channels 126 may remove heat from heat producing components on compute node assemblies 114 of computing system 144.

For illustrative purposes, rack 142 contains only one of computing systems 144. In various embodiments, however, a rack may hold any number of computing systems, compute nodes, systems or components.

In some embodiments, a computing system includes a chassis, one or more backplanes, and computing devices with circuit boards mounted in one or more rows on the backplanes. The computing system includes an air passage under the backplanes and air channels between the circuit boards on the backplanes. Openings in the backplanes allow air to move from the air passage under the backplanes into the air channels between the computing devices. Channel-capping elements (for example, plates) at least partially close the air channels between the computing devices. Each channel-capping element may close an air channel between a pair of adjacent circuit boards. The closed air channel may contain an air stream that cools components on the circuit boards. The channel-capping elements can be attached to each of the circuit board assemblies.

In some embodiments, a system includes a rack, a computing system, and one or more air moving devices. The rack can support the computing system in a withdrawn position (for example, slid out on rails from the fully installed position). The computing system remains in operation while the computing system is in the withdrawn position from the rack. The computing system includes computing devices (for example, compute nodes on circuit board assemblies). Air can be moved through air channels between the computing devices while the computing system is in the withdrawn position, such that the computing devices can continue to be cooled while the computing system is being serviced (for example, to repair or replace compute nodes). In some cases, the compute nodes are mounted on one or more backplanes. Air for cooling the compute nodes may be introduced through openings in the backplanes.

Figure 3:
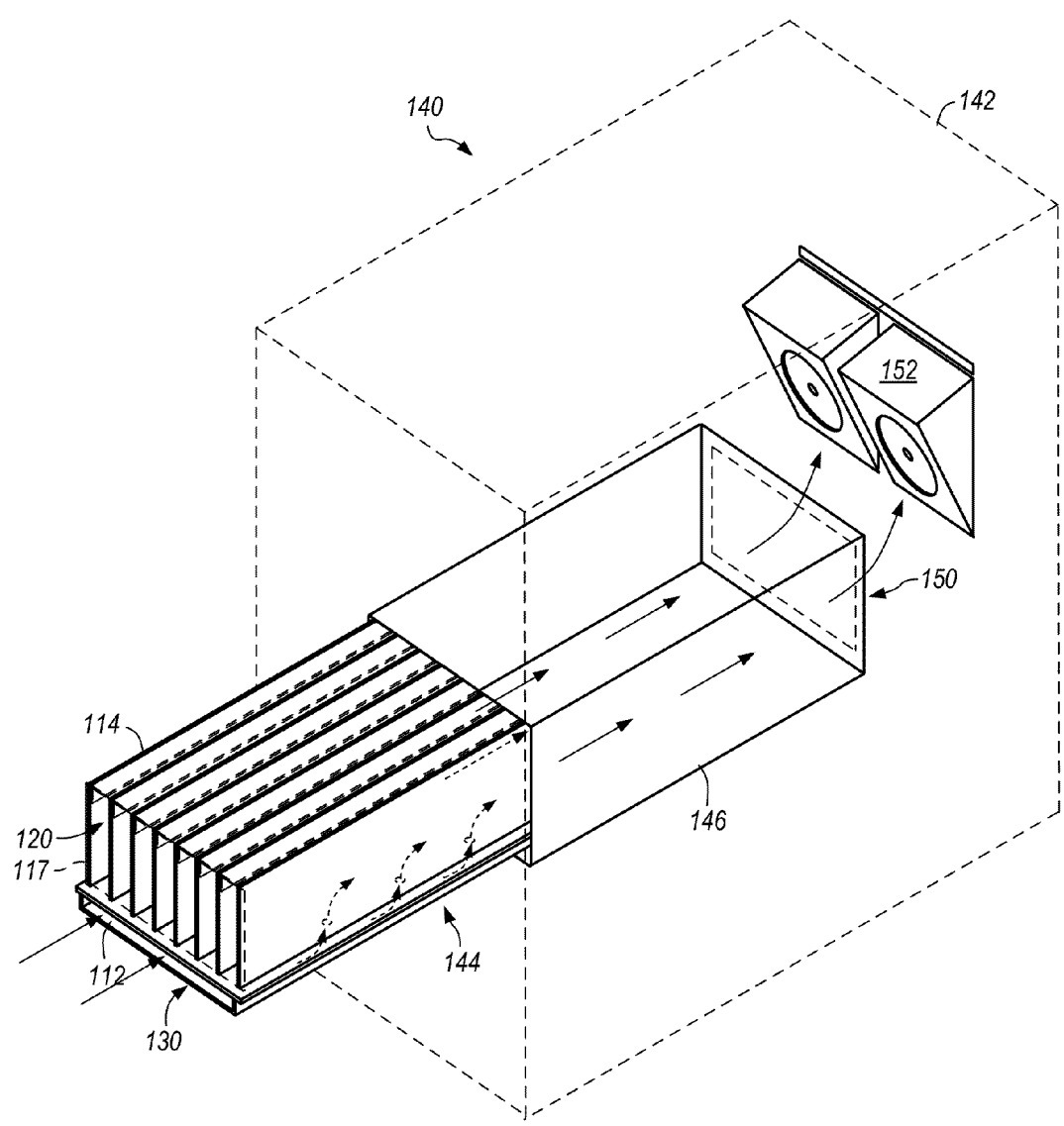
FIG. 3 illustrates one embodiment a computing system with sled-mounted compute nodes partially withdrawn from a rack.

FIG. 3 illustrates one embodiment of a computing system with sled-mounted compute nodes partially withdrawn from a rack. In the embodiment shown in FIG. 3, sled 108 has been withdrawn on shelf 146, but remains supported on shelf 146 in the withdrawn position. In some embodiments, some or all of the compute nodes of computing system 144 remain in operation while computing system 144 is in the withdrawn position.

In some embodiments, system 140 includes a cable management device. The cable management device may carry cables that connect computing system 144 to systems external to the computing system. In one embodiment, the cable management device includes an articulated arm (for example, a "zee" linkage with hinged connections between the links of the arm). Sections or links of the arm may unfold or unfurl when the computing device is pulled out from the fully installed position in the rack.

During operation of computing system 144 in the withdrawn position, rear fans 152 may continue to draw air through computing system 144. In particular, rear fans 152 may draw air through front inlet opening 130 into space below backplane 112, through openings in backplane 112 and into channels 126, and to the rear in channels 126. Box 148 may duct air expelled from channels 126 through rear opening 150 of shelf 146. Rear fans 152 may move the heated air out of the rack. In this manner, airflow may be maintained while computing system 144 is the partially withdrawn position. Airflow across components of computing system 144 may be maintained, for example, during maintenance of compute nodes of computing system 144.

Figure 4:
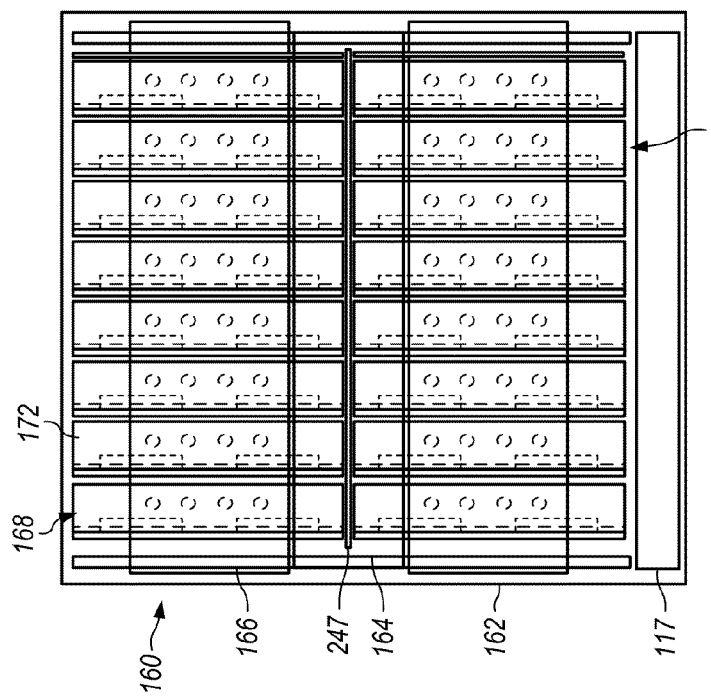
FIG. 4 is a top view illustrating one embodiment of a computing system having two rows of compute nodes on two separate backplanes.
Figure 5:
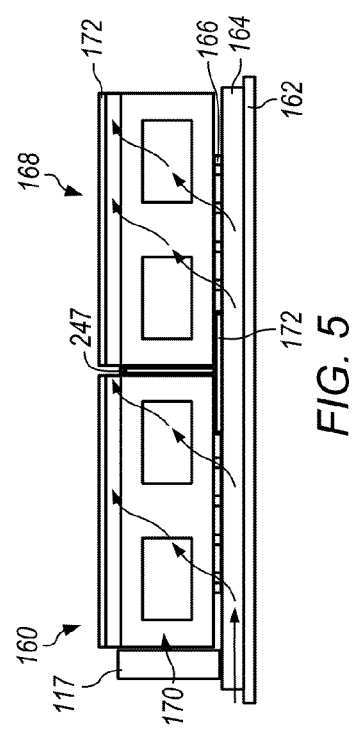
FIG. 5 is a side view illustrating one embodiment of a computing system with multiple rows of compute nodes having inter-node channels linked to one another.

In some embodiments, a computing system includes multiple rows of compute nodes. Each row of compute nodes may be on a different backplane. FIG. 4 is a top view illustrating one embodiment of a computing system having two rows of compute nodes on separate backplanes. FIG. 5 is a side view illustrating one embodiment of the computing system shown in FIG. 4. Computing system 160 includes sled 162, risers 164, backplanes 166, and compute nodes assemblies 168. Channels 170 are formed between adjacent pairs of compute node assemblies 168.

Air for cooling compute node assemblies 168 may be drawn into channels 170 through openings in the backplanes 166. In some embodiments, air is pulled from front to back of channels in the direction shown by the arrows in FIGS. 4 and 5. The arrangement of air moving devices and manner of operation may be similar to that above relative to FIGS. 2 and 3. Channel capping rims 172 may contain air in channels 170. Bridge plate 172 may duct air from the first row of compute node assemblies to the second row of compute node assemblies on the second backplane.

Figure 6:
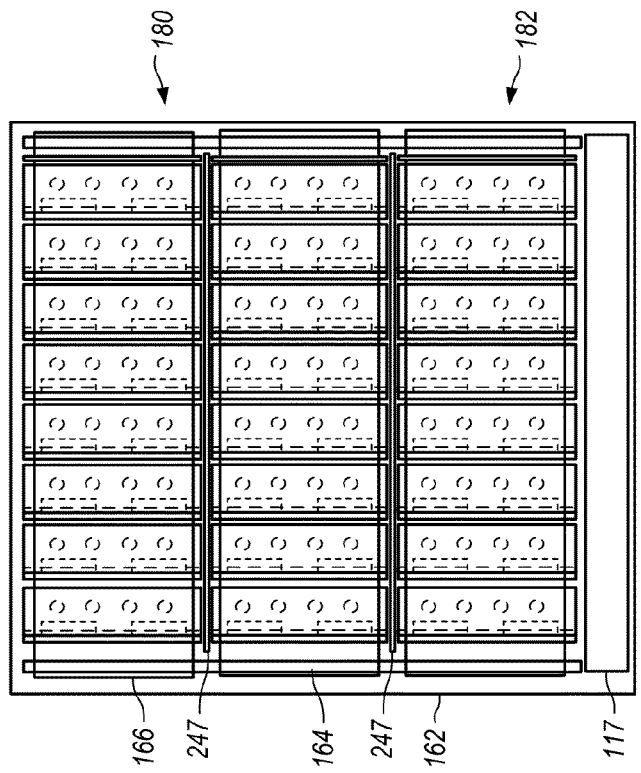
FIG. 6 is a top view illustrating one embodiment of a computing system reconfigured to include three rows of compute nodes on three separate backplanes.

In some embodiments, a computing system may be reconfigured to increase or reduce the number of rows compute nodes in the system. In some embodiments, the number of backplanes included from front to back of the computing system is increased or decrease. For example, referring to FIGS. 4 and 5, the number of backplanes/rows of compute nodes may be increased from two to three. FIG. 6 is a top view illustrating one embodiment of a computing system reconfigured to include three rows of compute nodes on three separate backplanes. Reconfigured system 180 includes three rows of computing devices 182. Each row is installed on a separate backplane 164. Relative to FIG. 4, the spacing between backplanes has been adjusted to accommodate the number of rows of compute nodes to be installed. In some embodiments, the same backplane is used regardless of the number of rows in the configuration. For example, the same backplane may be used in the three-row configuration shown in FIG. 6 as the two-row configuration shown in FIG. 4.

Figure 7:
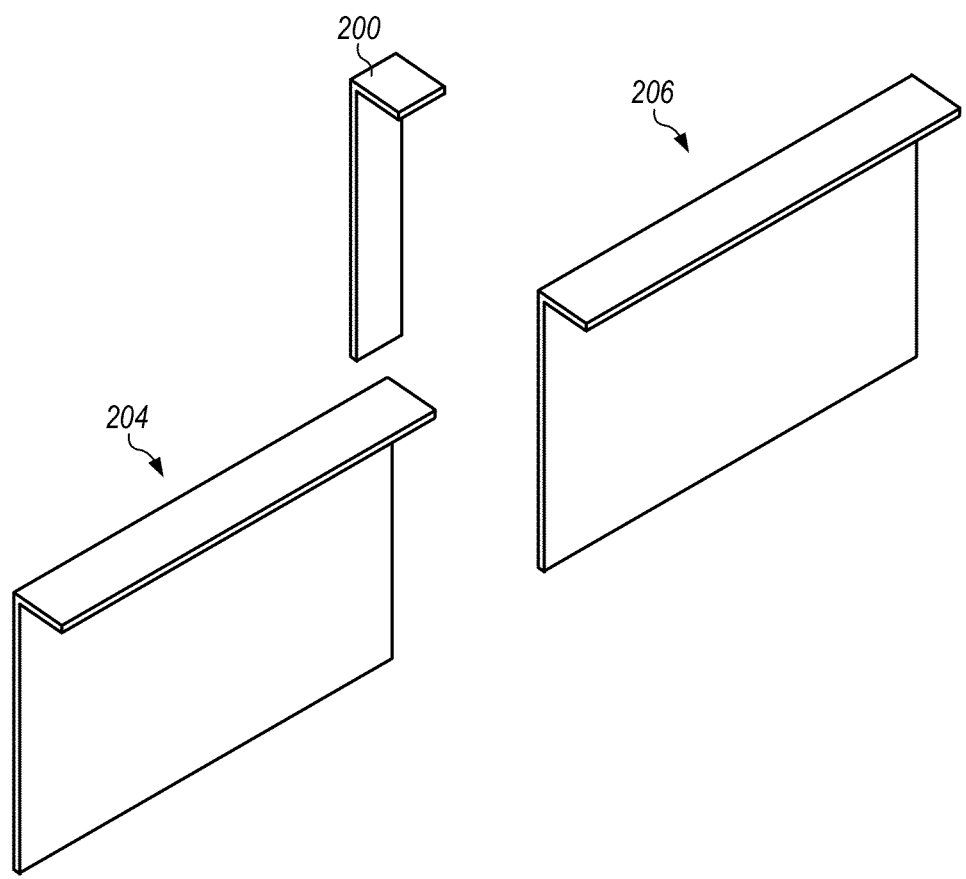
FIG. 7 illustrates a connector element between that can couple inter-node channels on adjacent rows in a computing system.

In some embodiments, elements are included to maintain continuity of airflow from one channel to another. FIG. 7 illustrates a connector element that may be used to couple inter-node channels on adjacent rows in a computing system. In FIG. 7, connector element 200 connects a channel formed between circuit boards on row 204 with a channel formed between circuit boards on row 208.

FIGS. 8A, 8B, 9A, 9B, 10A, 10B, 11A, and 11B illustrate operation and maintenance of a computing system with airflow maintained during maintenance operations on the computing system. FIGS. 8A and 8B illustrate top and side views of a computing system with sled-mounted compute nodes installed in a rack. System 240 includes rack 242 and computing system 244. Computing system 244 may be similar to computing system 160 described above relative to FIG. 4. Rack 242 includes computing system shelf 246. Shelf 246 includes box 248 and rear opening 250. Computing system 244 is supported on shelf 246. Rack 242 includes rear fans 252. Rear fans 252 may draw air through front inlet opening 130 into space below backplane 112, through openings in backplane 112 and into channels 126, through channels 126, and through rear opening 250 of shelf 246. Air moving through channels 126 may remove heat from heat producing components on compute node assemblies 114 of computing system 244.

Computing system 244 includes dividers 247 between rows of compute nodes. Dividers 247 may serve as barriers between adjacent rows. Dividers 247 may inhibit air flow between adjacent rows up to the height of dividers 247. Above the top edge of dividers 247, air may flow freely between rows. Accordingly, the air heated by each row of compute nodes may be drawn rearward and expelled from the rear of 242.

FIGS. 9A and 9B illustrate top and side views of a computing system with sled-mounted compute nodes with the sled partially withdrawn from the rack with continued air flow through channels between compute nodes. Sled 108 has been withdrawn on shelf 246, but remains supported on shelf 246 in the withdrawn position. With sled 108 in the withdrawn position, compute node assemblies 254 are accessible to allow service personnel to perform maintenance on computing system 244. In some embodiments, some or all of compute nodes of 254 computing system 244 remain in operation while computing system 244 is in the withdrawn position.

Figure 10A:
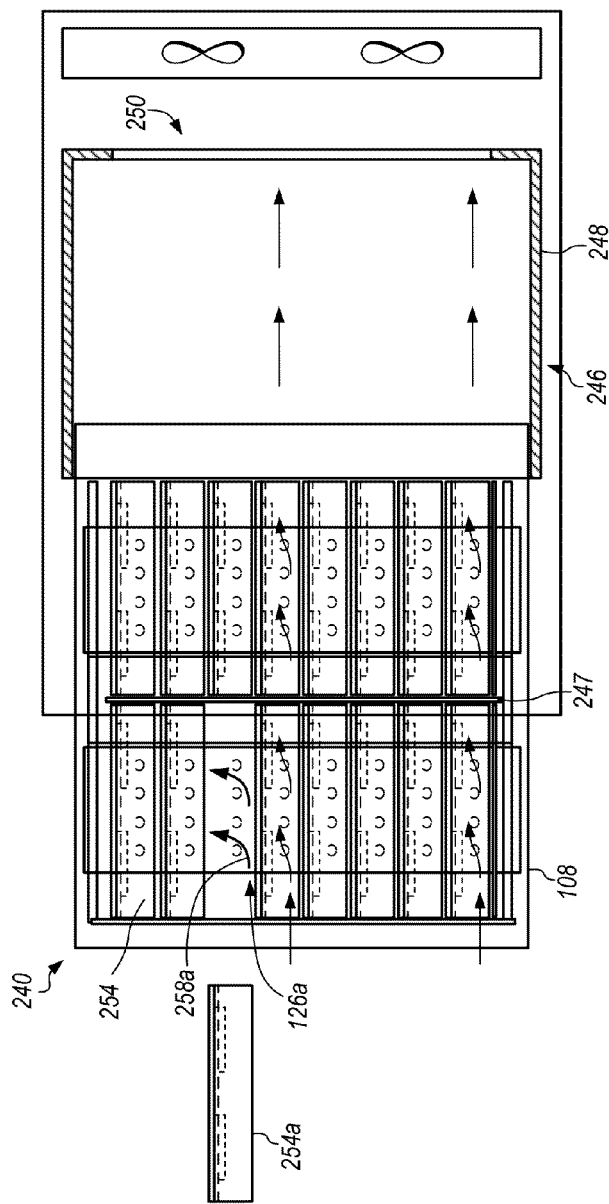
FIGS. 10A and 10B illustrate top and side views of a computing system with one compute node removed and continued air flow through channels between other remaining compute nodes.
Figure 10B:
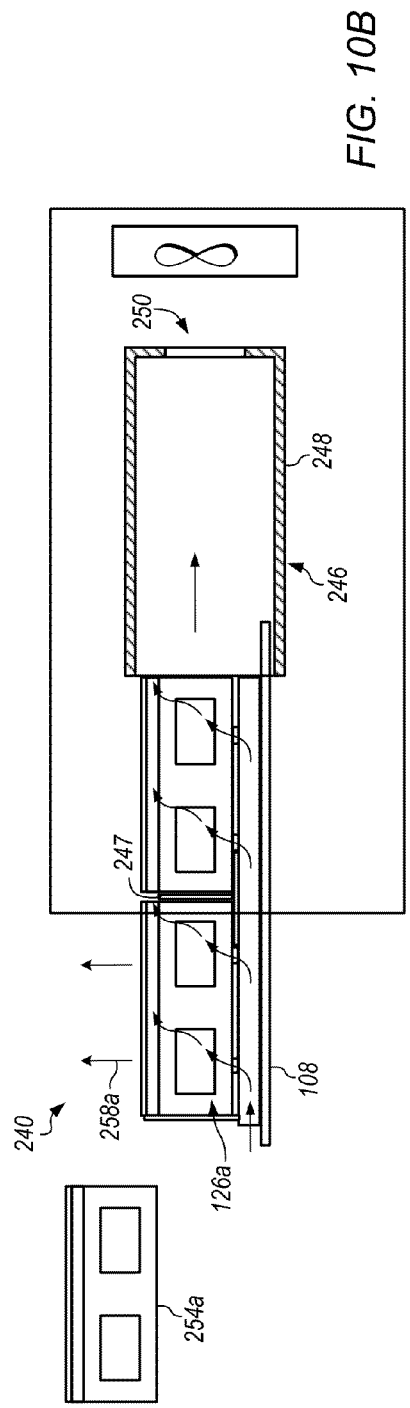

FIGS. 10A and 10B illustrate top and side views of a computing system with one compute node removed and continued air flow through channels between other remaining compute nodes. Compute node 254*a* has been removed from backplane 112. The removal of compute node 254*a* creates a gap in the channel-capping elements at the top of the array of circuit boards. With compute node 254*a* removed, channel 126*a* is no longer enclosed to duct air between the adjacent circuit boards, such that a leak or breach is created in the closed channel airflow arrangement. As such, air flow through backplane openings 124*a* may be substantially reduced. In addition, to the extent air is drawn through backplane openings 124*a*, much of the air may escape out the top opening, as illustrated by flow arrows 258*a*. Nevertheless, in all of the other channels 126 of computing system 244, air may continue to flow through the channels from front to back, such that cooling is maintained for all of the compute node assemblies adjacent to those channels.

In some embodiments, filler elements may be provided to fill enclose channels between circuit boards of a computing system. Filler elements may take the form of dummy modules, filler plates, bars, strips, and lids. FIGS. 11A and 11B illustrate top and side views of a computing system with a filler plate covering a gap where a compute node has been removed. Filler plate 260 is installed at the location of the opening at the top of channel 126*a*. Filler plate 260 may close channel 126a such that flow is restored in channel 126a, similar to that of the other channels 126 between the circuit boards on computing system 244.

In the system described above relative to FIGS. 11A and 11B, filler elements described in the context of maintaining airflow through channels between compute nodes during maintenance of one or more of the nodes. Filler elements may, however in various embodiments be used in any part of the life cycle of a computing system. For example, dummy modules or filler plates may be installed at open positions of a computing system when the computing system is initially built. The filler elements may be replaced by operating modules (for example, if additional compute capacity is needed for the system).

Figure 12:
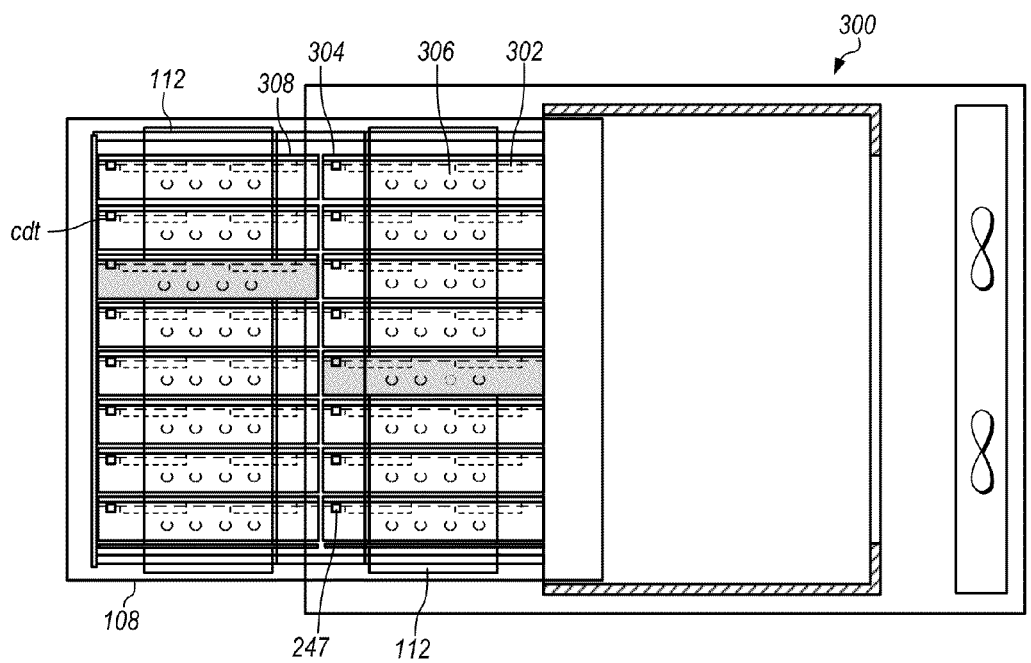
FIG. 12 illustrates one embodiment of a computing system with status indicator lights for compute nodes mounted on a backplane.

In some embodiments, compute nodes on a computing system include status indicators. The status indicators may include, for example, one or more light emitting diode indicators on each circuit board in an array of circuit boards mounted on backplanes on a common sled. FIG. 12 illustrates one embodiment of a computing system with status indicator lights for compute nodes mounted on a backplane. System 300 includes compute node assemblies 302. Compute node assemblies 302 include status indicators lights 304 and channel-capping rims 306. Status indicator lights 306 are mounted on compute node circuit boards 308. Channel-capping rims 306 may be transparent or translucent such that light from status indicator lights 304 on compute node circuit boards 308 shines through the channel-capping rims 306. Examples of materials that may be used for channel capping rims 306 include polycarbonate and poly methyl methacrylate ("PMMA"). In certain embodiments, status indicator lights for a compute node may be mounted on top of the compute node (for example, on a channel-capping rim attached to the compute node circuit board).

Status indicator lights 304 on compute node assemblies 302 may provide information about the status of the compute node. For example, a red status indicator light may indicate that the compute node has failed, while a green status light indicator may indicate that the compute node is working properly. Status light indicators may provide a visual aid to maintenance personnel to assess which of the compute nodes needs service.

Figure 13:
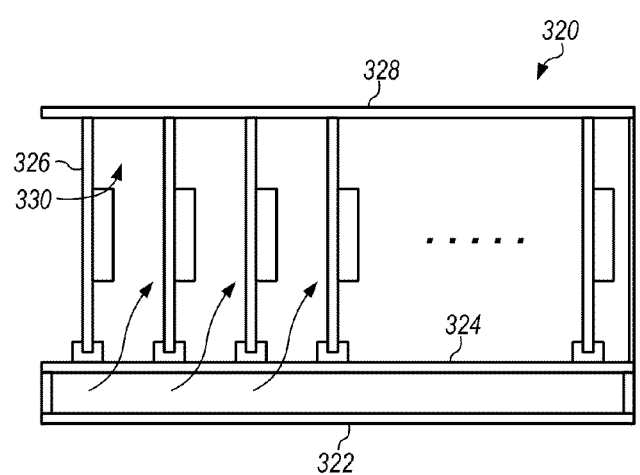
FIG. 13 illustrates a front view of a capping element that encloses multiple channels between compute nodes.

In various embodiments described above, the channel-capping element caps a single channel, and is attached to one of the circuit boards adjacent to a channel. Channel-enclosing elements may nevertheless in various embodiments enclose more than one channel. In addition, channel-enclosing elements may be attached to two or more circuit boards, or be attached to structural elements other than the circuit boards. FIG. 13 illustrates a front view of a capping element that encloses multiple channels between compute nodes. System 320 includes sled 322, backplane 324, compute node assemblies 326, and channel-enclosing cover 328. Channel enclosing cover 328 may be attached to two or more of compute node assemblies 326. Channel enclosing cover 328 may enclose channels 330 between compute node assemblies 326.

Figure 14:
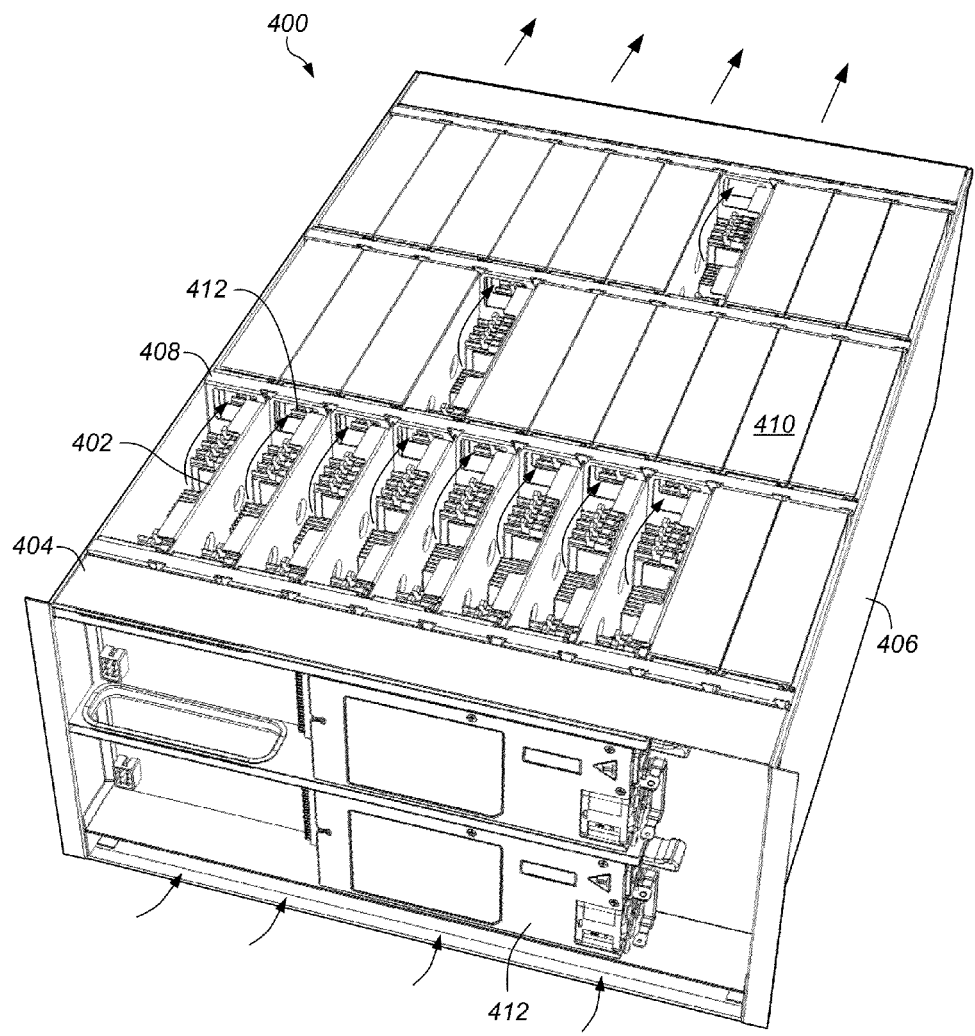
FIG. 14 illustrates one embodiment of a rack-mountable shelf unit with compute nodes mounted on backplanes.

FIG. 14 illustrates one embodiment of a rack-mountable shelf unit with compute nodes mounted on backplanes. Compute shelf 400 includes compute node modules 402, shared resource module 404, chassis 406, cross-braces 408, and channel capping plates 410. Compute shelf 400 may be mountable in a rack. Compute node modules 402 may be mounted on chassis 406 by way of one or more backplanes. Shared resource module 404 may be mounted chassis 406. (Some of the locations where channel capping plates could be installed are shown without plates for illustrative purposes).

Shared resource module 404 may include modules to provide resources to compute nodes 402. For example, shared resource module 404 includes power supply units 412. Compute nodes 402 may share other common resources, such as mass storage devices (for example, hard disk drives) or network switches.

Cross-braces 408 may subdivide the row of compute node modules 402. In some embodiments, cross braces hold the side edges of the circuit boards of compute node modules 402. The lower portion of cross braces 408 may serve as a barrier that inhibits cooling air from passing between the different rows of compute node modules 402. Cross-braces 408 may include air flow openings 414. Air flow openings 414 may allow air to flow from one row to another near the top of shelf 404. Channel capping plates 410 may inhibit air flowing in the channels from dissipating out the top of chassis 406.

Figure 15:
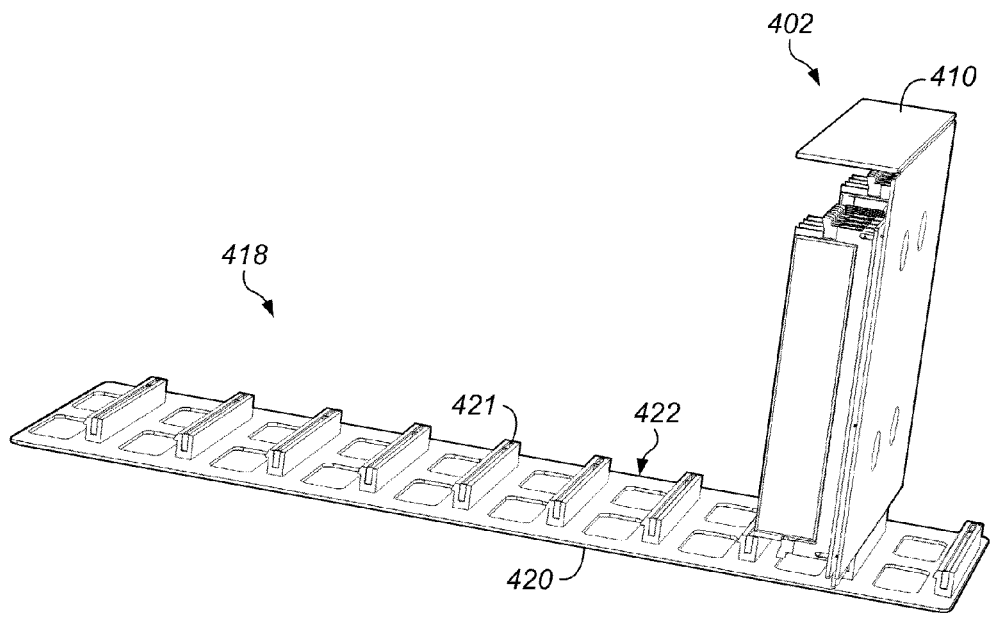
FIG. 15 illustrates one embodiment of a compute node mounted on backplane assembly.

FIG. 15 illustrates one embodiment of a compute node mounted on backplane assembly. Backplane assembly 418 includes backplane printed circuit board 420 and card guides 421. A compute node module 402 may be mounted in each of card guides 421. Backplane printed circuit board 420 includes apertures 422. Apertures 422 allow airflow through backplane printed circuit board 420.

Figure 16:
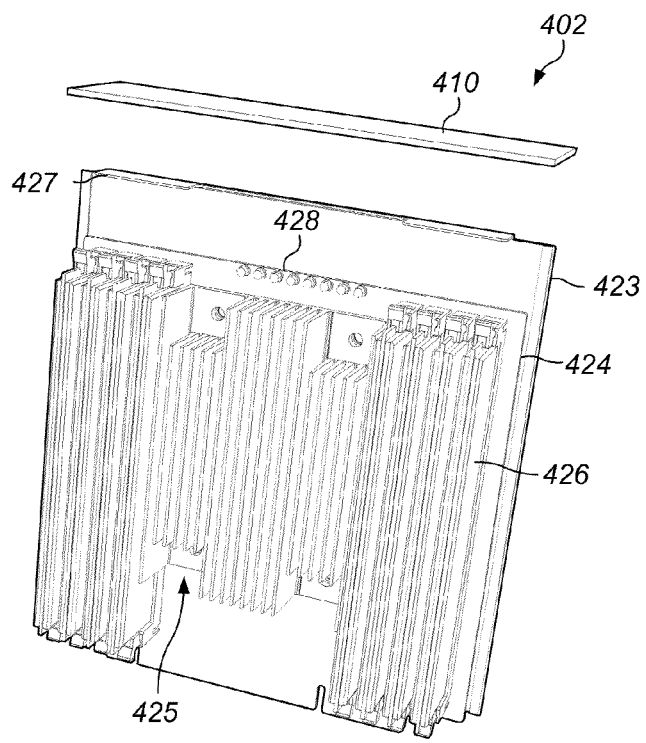
FIG. 16 illustrates a partially exploded view of one embodiment of a compute node with a channel-capping plate.

FIG. 16 illustrates a partially exploded view of one embodiment of a compute node with a channel-capping plate. Compute node module 402 includes mounting plate 423, compute node printed circuit board 424, processor assembly 425, memory modules 426, and indicator lights 427. Processor assembly 425 includes a processor and heat sink mounted to compute node printed circuit board 424. Mounting plate 423 includes tabs 428. Channel capping plate 410 may be attached to tabs 428. In some embodiments, channel capping plate 410 is clear or translucent, such that the state of indicator lights 427 (on/off, color) can be seen from above the shelf by maintenance personnel.

Figure 17:
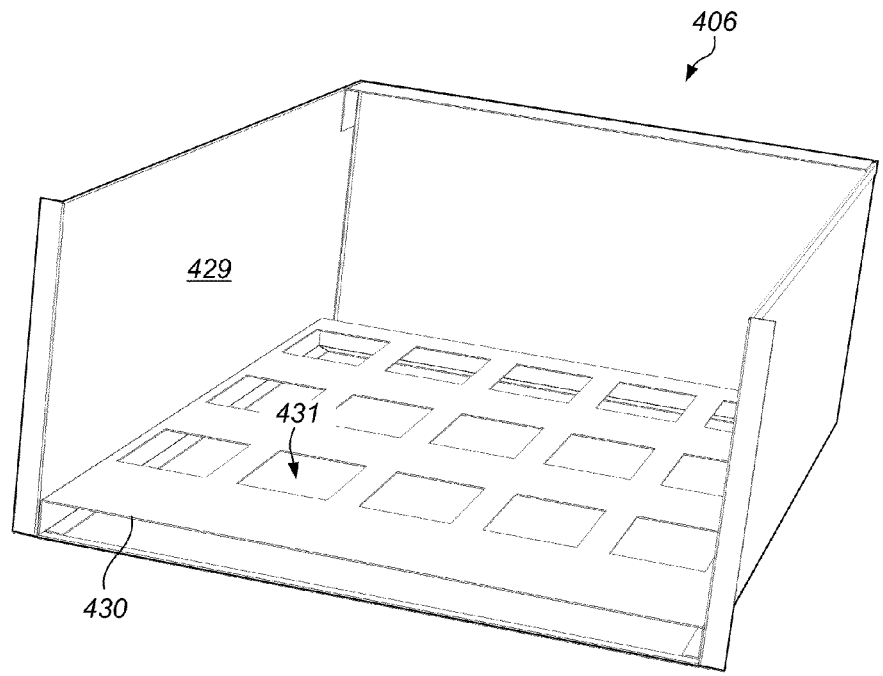
FIG. 17 illustrates one embodiment of a chassis for compute shelf with a backplane mounting plate.

FIG. 17 illustrates one embodiment of a chassis for compute shelf with a backplane mounting plate. Chassis 406 include chassis enclosure 429 and bottom duct member 430. Bottom duct member 430 is mounted at the bottom of chassis enclosure 429. Bottom duct member 430 includes apertures 431. Apertures 431 allow air to flow from duct 433 (for example, through backplane assemblies mounted on the duct).

Figure 18:
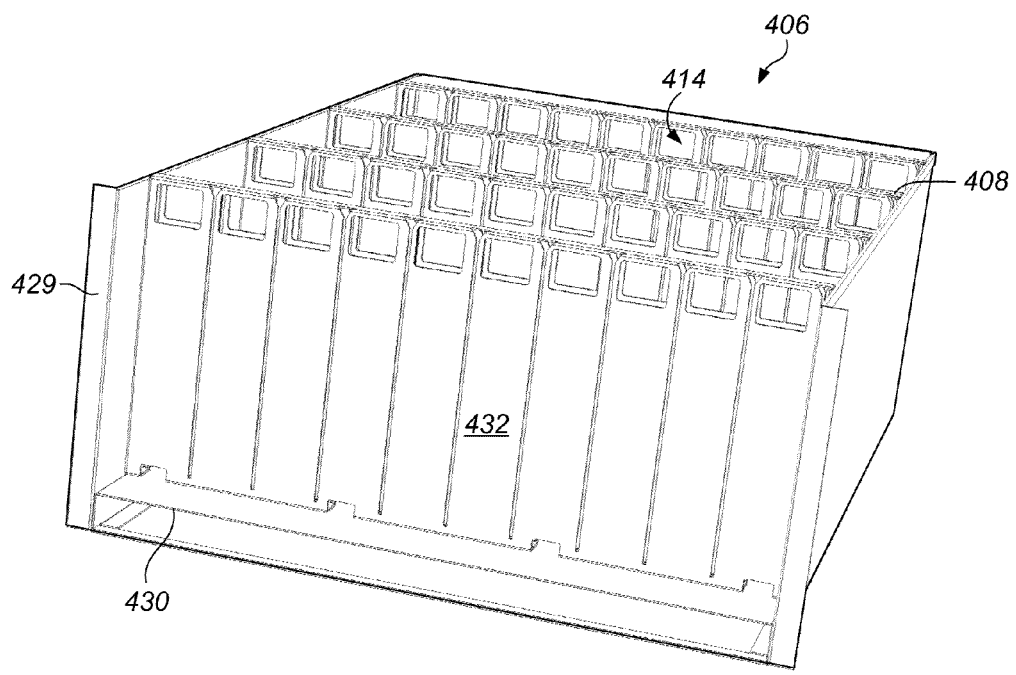
FIG. 18 illustrates one embodiment of a chassis for a compute node shelf with cross-braces that partition rows of compute nodes.

FIG. 18 illustrates one embodiment of a chassis for a compute node shelf with cross-braces that partition rows of compute nodes. Cross-braces 408 are mounted at spaced intervals from front to back in chassis 406. Cross-braces 408 may serves as guide or supports for compute node modules mounted on backplanes between adjacent cross braces. Wall 432 may serve as a barrier that keeps air flowing within a given row of compute nodes (rather than, for example, dissipating into rows farther back in the shelf.

Figure 19:
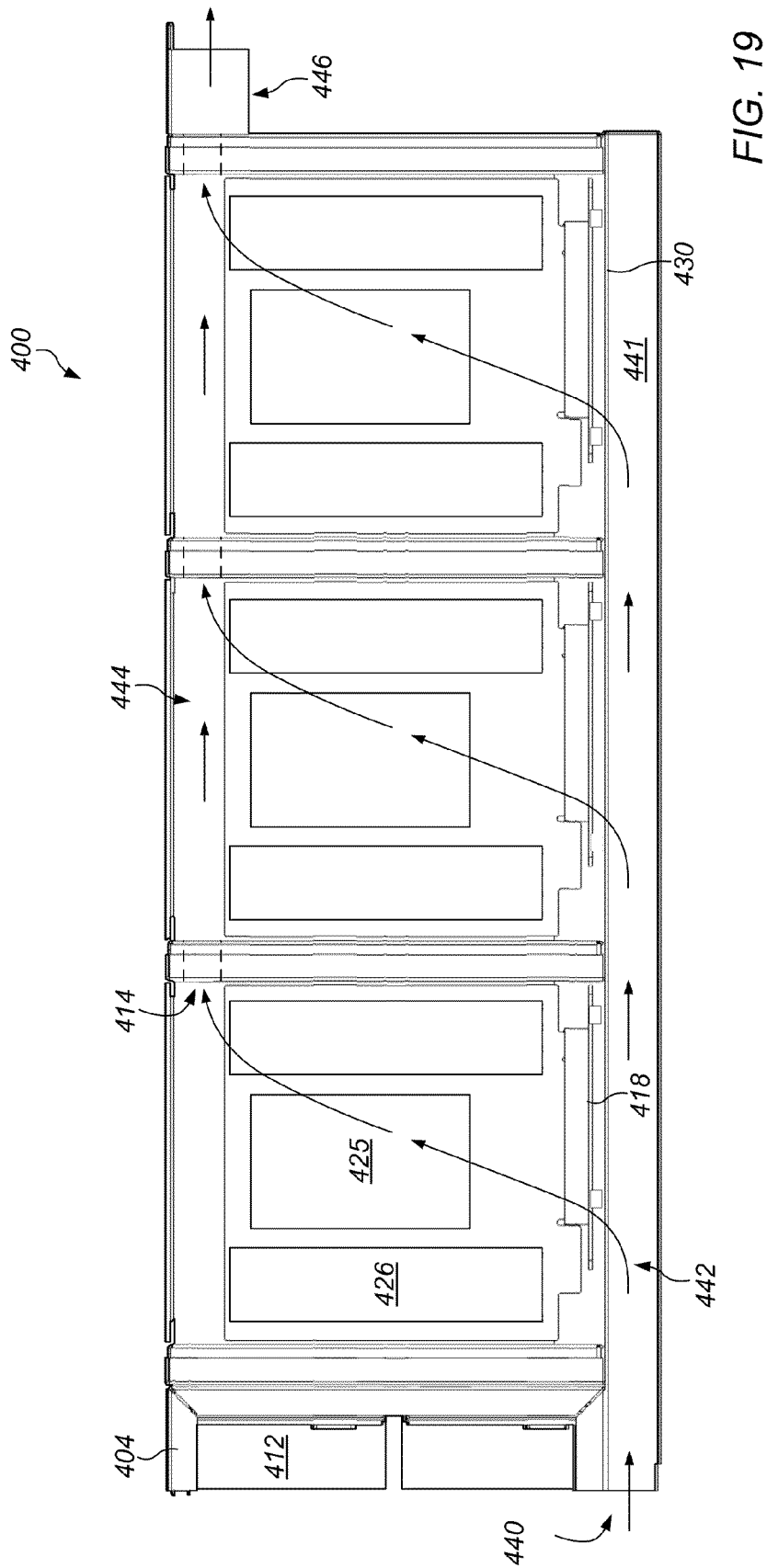
FIG. 19 is a side view of a compute shelf with arrows indicating air flow through the shelf.

FIG. 19 is a side view of a compute shelf with arrows indicating air flow through the shelf. An air moving device, such as a fan, may move air in through bottom inlet 440 and into lower duct space 441. Lower duct space 441 may serve as a plenum for air to be fed into channels between compute nodes. Air may pass from lower duct space 441 through apertures 431 in bottom duct member 430, through apertures in backplane assembly 418, and upwardly across heat producing components on compute node modules 402, as shown by the arrows in FIGS. 14 and 19. Once the heated air reaches the top part of the channels, the air may be moved out of the shelf via upper channel 444 (successively, through air flow openings 414) toward the rear of compute shelf 400 (as shown, for example, by arrows in FIGS. 15 and 19.) Channel capping plates 410 may contain the heated air within upper channel 444. At the rear of the shelf, air may be expelled from upper channel through exhaust vent 446.

In various embodiments described above, a compute node circuit boards are mounted in a vertical orientation on top of a backplane mounted in a horizontal orientation. Compute nodes and backplanes with cross-backplane airflow may nevertheless in various embodiments be mounted in any orientation. In one embodiment, compute nodes are mounted horizontally on a backplane that is in a vertical orientation. Air may flow through a duct on the side of the backplane that is opposite to the compute nodes, and then pass through the backplane to feed channels between compute nodes.

In some embodiments, compute nodes are mounted in a vertical orientation to the underside of a backplane that is in a horizontal orientation. An air passage above the backplane may feed air through into channels between the compute nodes.

Figure 20:
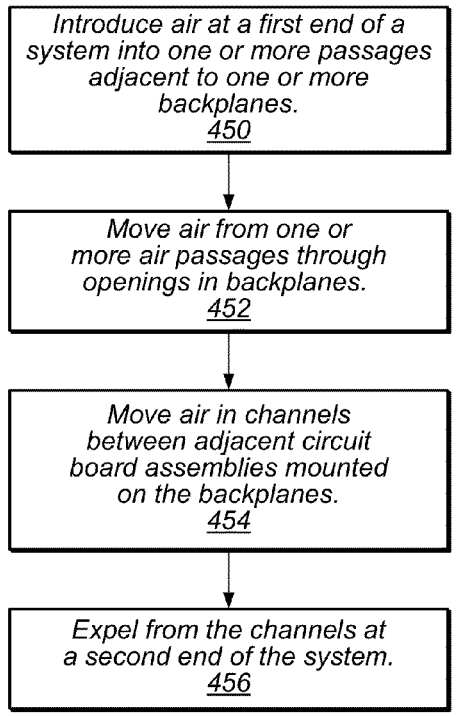
FIG. 20 illustrates cooling computing devices mounted on one or more backplanes with flow through channels between circuit board assemblies.

FIG. 20 illustrates cooling computing devices mounted on one or more backplanes with flow through channels between circuit board assemblies. At 450, air at a first end of a system is introduced into one or more passages adjacent to one or more backplanes. In some embodiments, the passage is below the backplane and the circuit board assemblies are above the backplanes.

At 452, air from one or more air passages is moved through openings in the backplanes. One or more of the openings may be farther from the first end than at least one other of the openings.

At 454, air is moved in channels formed between adjacent circuit board assemblies mounted on the backplanes. At 456, air in the channels is expelled at a second end of the system.

In some embodiments, the channels are enclosed to contain a stream of air flowing in the channels. In one embodiment, a channel is enclosed by attaching capping elements (for example, channel-capping rims 120 described above relative to FIG. 1) to one or more of the circuit board assemblies adjacent to the channel.

Figure 21:
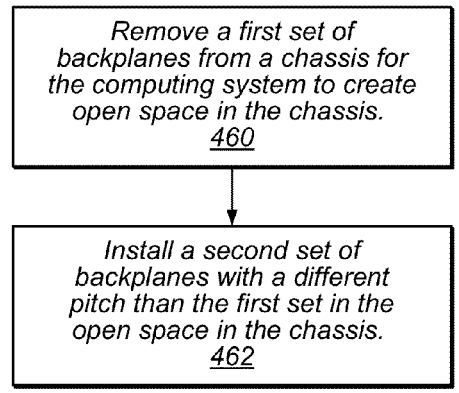
FIG. 21 illustrates altering a configuration of computing system that includes removing a set of computing devices in rows at one pitch, and replacing them with a set of computing devices in rows having a different pitch.

FIG. 21 illustrates altering a configuration of computing system that includes removing a set of computing devices in a set of rows at one pitch, and replacing them with a set of computing devices in a set of rows having a second pitch. At 460, a first set of backplanes is removed from a chassis for the computing system to create open space in the chassis. The first set of backplanes may support computing devices in two or more rows between one end and another end of the chassis at a first pitch from row to row.

At 462, a second set of backplanes is installed in the open space in the chassis. The second set of backplanes supports a second set of computing devices in two or more rows between one end and another end of the chassis at a second pitch from row to row, the second pitch from row to row of the second set of computing devices is less than or greater than the first pitch from row to row of the first set of computing devices. For example, the first set of computing devices may be arranged in three rows, each of the three rows being mounted on a separate backplane, while the replacement set of computing devices is mounted in two rows, each of the two rows being mounted on separate backplane. The number of computing devices, the number of rows of computing devices, or both, may be changed during reconfiguration of the computing system.

Figure 22:
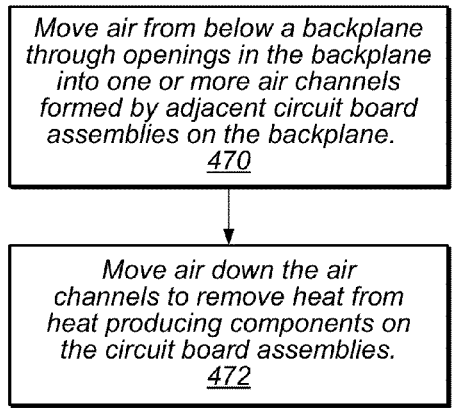
FIG. 22 illustrates cooling computing devices includes moving air from below a backplane into channel such that the air flows down the length of the channel.

FIG. 22 illustrates cooling computing devices includes moving air from below a backplane into channel such that the air flows down the length of the channel. At 470, air is moved below a backplane through openings in the backplane into one or more air channels formed by adjacent circuit board assemblies on the backplane.

At 472, air is moved down the air channels to remove heat from heat producing components on the circuit board assemblies. In some embodiments, the channels are capped to inhibit air from leaving the channel. For example, a channel-capping rim may be attached to a circuit board to close an air channel on either or both sides of the circuit board. In some embodiments, air is moved successively through channels in two or more rows of computing devices, such as shown above relative to FIGS. 4 through 6.

Figure 23:
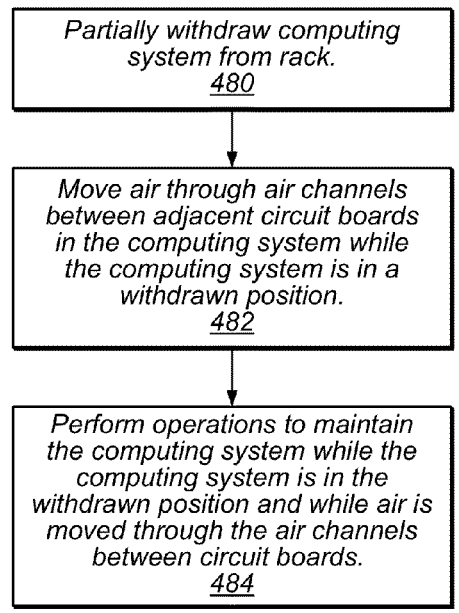
FIG. 23 illustrates compute node maintenance with continuous cooling.

FIG. 23 illustrates compute node maintenance with continuous cooling. At 480, a computing system is partially withdrawn from a rack. For example, the computing system may be pulled out on rails of the rack such that the computing system remains supported on the rails.

At 482, air is moved through air channels between adjacent circuit boards in the computing system while the computing system is in a withdrawn position.

At 484, operations are performed to maintain the computing system while the computing system is in the withdrawn position and while air is moved through the air channels between circuit boards. In some embodiments, a computing device is hot-swapped while other computing devices continue to be cooled by air flowing in air channels between adjacent circuit boards. In some embodiments, air is moved from below a backplane on which the computing devices in the rack are mounted.

In some embodiments, backplanes are mounted to reduce or minimize transmission of shock and/or vibration loads between each hard disk drive and a chassis and between hard disk drives within a system. For example, backplane circuit board assemblies may be mounted on pads. The pads may be made of a shock absorbing material, such as an elastomeric material. The pads may reduce transmission of shock and/or vibration between a shelf or chassis and the compute node circuit boards of a computing system.

In some embodiments, elements of disk drive backplanes and a chassis may combine to form a box section mounting for hard disk drives. For example, the shelf, spacers, and one or more of the backplane circuit board assemblies illustrated in FIG. 1 may combine to form a rectangular box section. The box section may reduce deformation of a chassis, such as sagging of chassis bottom panel. In some embodiments, rails, pads, a tray, or similar structural elements may serve multiple functions, including forming the box section structure, space for cable runs, and space for air flow.

In some embodiments, the size and number of opening in a backplane may be selected to tune the air flow through various compute nodes a chassis. For example, in one embodiment, the vents for the backplanes near the rear of the chassis may larger than the vents for the backplanes near the front of the chassis, since a greater airflow may be required near the rear of the chassis because of the relatively warm air in that portion of the chassis.

Figure 24:
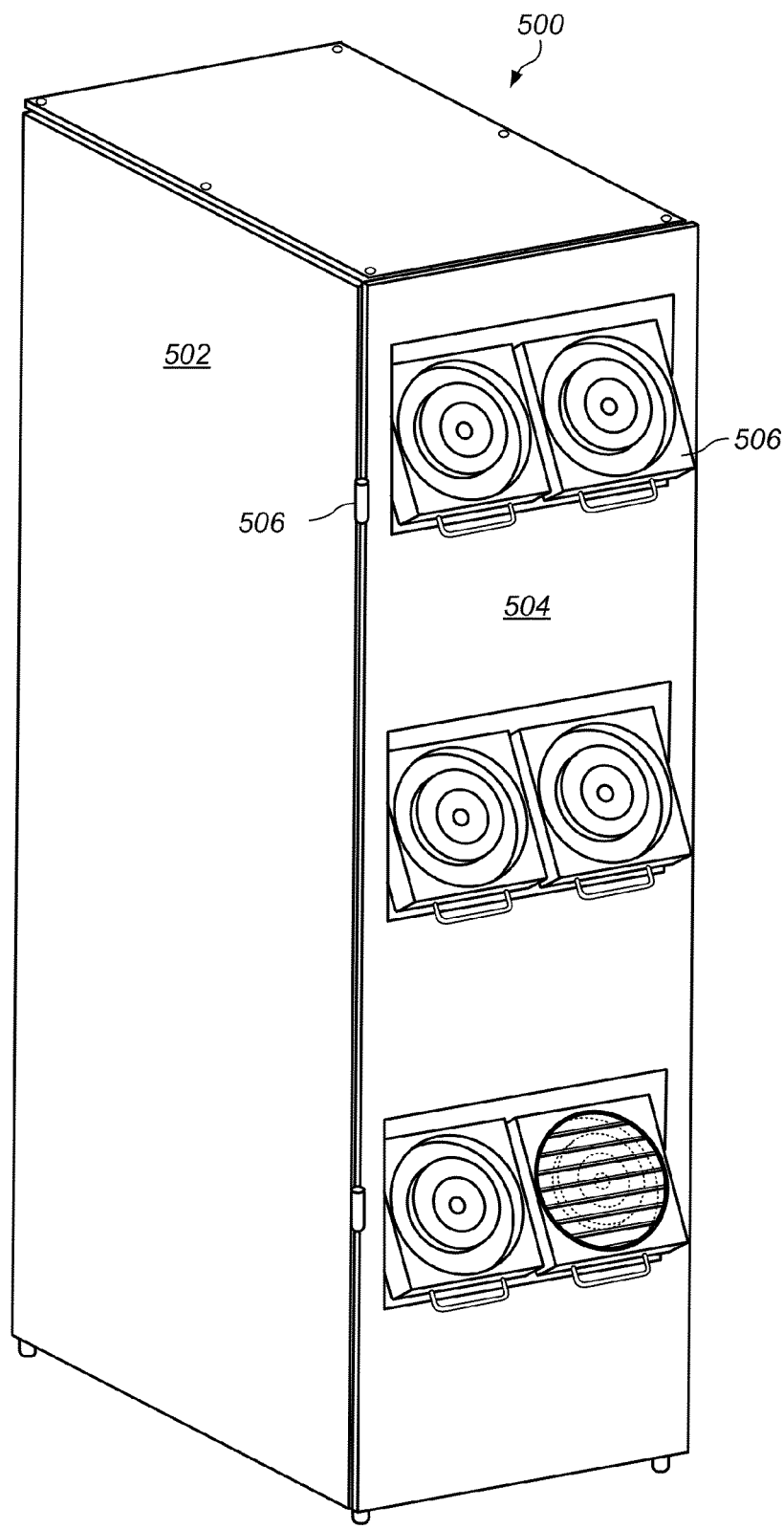
FIG. 24 illustrates a rear view of one embodiment of a rack system having rear-mounted fans.

In some embodiments, a rack-level air moving devices are implemented by way of a fan door. FIG. 24 illustrates a rear view of one embodiment of a rack system. System 500 includes rack 502 and rear door 504. Rear door 504 couples with rack 502 on hinges 506. Fan modules 508 couple with, and are supported by, rear door 504.

In some embodiments, fan modules 508 include alternating current (AC) fans. In one embodiment, the fans have an input voltage rating of about 100V-120V. In one embodiment, the fans have an input voltage rating of about 230 V. Fan modules 300 may receive power from rack level power distribution units. In some embodiments, fan modules 508 in a rack are hot swappable. In some embodiments, a manual power switch is provided for each of fan modules 508.

In one embodiment, each fan operates at a flow rate between 50 to 100 cubic feet per minute. In one embodiment, each of the fans operates at a flow rate about 200 cubic feet per minute.

In some embodiments, a system may include variable speed fans. In certain embodiments, power switching and/or fan speed may be controlled automatically. Fans may be controlled individually, or in groups of two or more fans. In some embodiments, fans are controlled based on sensors data (for example, temperature sensors in the rack).

In some embodiments, one or more fans for a rack system may be controlled via a control system. In certain embodiments, a control system includes at least one programmable logic controller. The PLC may receive measurements of conditions in the rack or at other locations in a data center. A PLC may receive data corresponding to air flow rate, temperature, pressure, humidity, or various other operating or environmental conditions.

In one embodiment, the PLC receives data from one or air flow sensors that measure airflow in the rack. Based on sensor data, the PLC may control parameters such as fan speed, as appropriate for the prevailing operational conditions. In another embodiment, the PLC receives data from one or more temperature sensors that measure temperature in the rack and/or at other locations in a data center. In certain embodiments, a PLC may modulate dampers between open and closed positions to modulate airflow, as appropriate for the prevailing operational conditions.

In some embodiments, rack-mounted computing modules are commonly cooled by a cooling air system that delivers air to the rack. To remove heat from computing modules installed in the rack, an air handling system may be operated to cause air to flow in computer room and through the rack system. As the air reaches the front of each of computing modules, the air may pass through the chassis of the computing modules. After passing through the chassis, the heated air may exit the rear of the rack system and flow out of the computer room. In certain embodiments, computing modules may have on board fans in addition to, or lieu of, a central cooling system. In certain embodiments, a rack may have a fan that supplies cooling air to all of the computing modules in the rack.

For clarity, modules or other components in many of the figures herein have been shown with a simple box outline around functional components. In various embodiments, a module or a chassis for a module may include an enclosure, a tray, a mounting plate, a combination thereof, as well as various other structural elements.

Although the embodiments above have been described in considerable detail, numerous variations and modifications will become apparent to those skilled in the art once the above disclosure is fully appreciated. It is intended that the following claims be interpreted to embrace all such variations and modifications.

What is claimed is:

1. A computing system, comprising:
   a chassis;
   an air inlet end;
   an air exit end opposite the air inlet end;
   one or more backplanes coupled to the chassis;
   a plurality of computing devices coupled to the at least one backplane, wherein at least two of the computing devices comprise a circuit board assembly and one or more processors coupled to the circuit board assembly;
   one or more air passages adjacent to at least one of the backplanes, wherein at least one of the air passages is configured receive air from the air inlet end of the system; and
   one or more air channels, wherein at least one of the air channels is configured to channel air between two or more adjacent circuit board assemblies of the computing devices on the at least one backplane, wherein at least one of the air channels is configured channel air toward the air exit end and expel air at the air exit end of the system,
   wherein the at least one backplane comprises a plurality of openings configured to allow air to pass from at least one of the air passages to at least one of the air channels, wherein at least one of the openings is farther from the air inlet end than at least one other of the openings.

2. The computing system of claim 1, wherein air at least one of the air channels runs lengthwise between the air inlet end and the air exit end of the system.

3. The computing system of claim 1, wherein in at least one of the channels is configured to channel air upwardly across at least one of the circuit board assemblies and at least one of the channels is configured to channel air toward the air exit end of the system.

4. The computing system of claim 1, wherein the one or more backplanes comprise two or more backplanes coupled to the chassis, wherein at least one row of computing devices is coupled to each of the two or more backplanes.

5. The computing system of claim 1, wherein the one or more backplanes comprise two or more backplanes coupled to the chassis, wherein at least two of the backplanes are arranged successively from the air inlet end to the air exit end.

6. The computing system of claim 1, further comprising one or more air moving devices configured to move air through at least one of the one or more air passages under the backplanes.

7. The computing system of claim 1, further comprising one or more channel-capping elements, wherein at least one of the channel-capping elements is configured to at least partially close at least one of the channels.

8. The computing system of claim 1, further comprising one or more air moving devices configured to move air from one or more passages on one side of the at least one backplane through the one or more openings into at least one of the channels.

9. The computing system of claim 1, wherein the computing system is mounted in a rack, wherein the computing system is configured to remain in operation when the computing system is at least partially withdrawn from the rack, wherein at least one of the air channels is configured to channel air from below the at least one backplane when the computing system is at least partially withdrawn from the rack.

10. The computing system of claim 1, wherein the at least one backplane is in a primarily horizontal orientation, wherein the at least one backplane is configured to allow air to pass from under the at least one backplane into one or more air channels between adjacent computing devices.

11. The computing system of claim 1, wherein the plurality of computing devices comprise two or more rows of computing devices.

12. The computing system of claim 11, wherein the computing system further comprises one or more barriers between at least two of the rows, wherein at least one of the barriers is configured to inhibit air from moving between adjacent rows of the computing devices.

13. The computing system of claim 1, further comprising one or more shared resource devices coupled to the chassis, wherein at least one of the shared resource devices is configured to provide shared resources to two or more of computing devices.

14. A method of cooling computing devices on a chassis, comprising:
- introducing air at a first end of a system into one or more passages on a first side of one or more backplanes;
- moving at least a portion of the air from one or more air passages through a plurality of openings in at least one of the backplanes, wherein at least one of the openings is farther from the first end than at least one other of the openings; and
- moving air in one or more channels formed between two or more adjacent circuit board assemblies mounted on a side of the at least one backplane that is opposite the first side; and
- expelling, at a second end of the system that is opposite the first end, at least a portion the air from at least one of the channels.

15. The method of claim 14, further comprising at least partially enclosing at least one of the channels to at least partially contain a stream of air flowing in the at least one channel.

16. The method of claim 14, wherein at least partially enclosing at least one of the channels comprises attaching one or more capping elements to one or more of the circuit board assemblies.

17. The method of claim 14, wherein moving air it one or more channels comprises moving air in a channel formed in each of two or more successive rows of computing devices arranged between the first end of the computing system and the second end.

18. The method of claim 14, wherein introducing air comprises:
- introducing a first portion of air through openings on a first backplane supporting a first row of computing devices; and
- introducing a second portion of air through openings on a second backplane supporting a second row of computing devices.

* * * * *